US012745571B2

(12) United States Patent
Wang et al.

(10) Patent No.: US 12,745,571 B2
(45) Date of Patent: Sep. 22, 2026

(54) SCALABLE SPINTRONIC DEVICES FORMED ON SILICON WAFERS

(71) Applicants: Regents of the University of Minnesota, Minneapolis, MN (US); Government of the United States of America, as represented by the Secretary of Commerce, Gaithersburg, MD (US); Theiss Research, Inc., La Jolla, CA (US)

(72) Inventors: Jian-Ping Wang, Shoreview, MN (US); Deyuan Lyu, Minneapolis, MN (US); Daniel B. Gopman, Gaithersburg, MD (US); Jenae E. Shoup, La Jolla, CA (US)

(73) Assignees: Regents of the University of Minnesota, Minneapolis, MN (US); Government of the United States of America and Theiss Research, Inc.

( * ) Notice: Subject to any disclaimer, the term of this patent is extended or adjusted under 35 U.S.C. 154(b) by 165 days.

(21) Appl. No.: 18/435,084

(22) Filed: Feb. 7, 2024

(65) Prior Publication Data

US 2025/0311638 A1 Oct. 2, 2025

Related U.S. Application Data

(60) Provisional application No. 63/483,667, filed on Feb. 7, 2023.

(51) Int. Cl.

| | |
|---|---|
| *G11C 11/00* | (2006.01) |
| *H10B 61/00* | (2023.01) |
| *H10N 50/01* | (2023.01) |
| *H10N 50/10* | (2023.01) |
| *H10N 50/85* | (2023.01) |

(52) U.S. Cl.

CPC ............. *H10N 50/85* (2023.02); *H10B 61/20* (2023.02); *H10N 50/01* (2023.02); *H10N 50/10* (2023.02)

(58) Field of Classification Search

CPC ........ H10N 50/85; H10N 50/01; H10N 50/10; H10B 61/20

USPC ........................................................ 365/158

See application file for complete search history.

(56) References Cited

U.S. PATENT DOCUMENTS 7,820,064 B2 * 10/2010 Jin .......................... C23C 14/04 216/41

7,981,697 B2 * 7/2011 Wang ...................... G11C 11/15 365/158

(Continued)

OTHER PUBLICATIONS

"Failure Mechanism Based Stress Test Qualification for Integrated Circuits", Automotive Electronics Council, Sep. 11, 2014, 48 pp.

(Continued)

*Primary Examiner* — Viet Q Nguyen

(74) *Attorney, Agent, or Firm* — Shumaker & Sieffert, P.A.

(57) ABSTRACT

A device which includes a silicon wafer substrate and a seed layer formed on a surface of the silicon wafer substrate. The device also includes a perpendicular magnetic anisotropy (PMA) layer exhibiting crystalline PMA formed on the seed layer, wherein the PMA structure comprises at least one of iron-palladium (FePd) alloy, iron-platinum alloy (FePt), or iron-platinum-palladium alloy ($Fe(Pt_xPd_{(1-x)})$).

20 Claims, 9 Drawing Sheets

(56) References Cited

U.S. PATENT DOCUMENTS

| | | | | |
|---|---|---|---|---|
| 8,476,925 | B2 * | 7/2013 | Zhu | G11C 11/16 326/38 |
| 8,981,505 | B2 * | 3/2015 | Moriyama | G11C 11/161 257/E29.323 |
| 9,449,668 | B2 * | 9/2016 | Kent | G11C 11/161 |
| 9,520,443 | B2 * | 12/2016 | Khalili Amiri | H10B 61/00 |
| 9,978,931 | B2 * | 5/2018 | Hu | G11C 11/161 |
| 10,014,013 | B2 * | 7/2018 | Kryder | G11B 5/65 |
| 10,102,893 | B2 * | 10/2018 | Lee | H10N 50/10 |
| 10,103,317 | B2 * | 10/2018 | Hu | H10N 50/10 |
| 10,381,060 | B2 * | 8/2019 | Kan | H10B 61/00 |
| 10,460,786 | B2 * | 10/2019 | Lee | G11C 11/161 |
| 10,546,997 | B2 | 1/2020 | Wang et al. | |
| 11,489,108 | B2 * | 11/2022 | Le | H01F 10/3272 |
| 11,765,984 | B2 * | 9/2023 | Huang | H10N 50/85 257/247 |
| 11,910,721 | B2 * | 2/2024 | Guo | H10N 50/80 |
| 12,364,164 | B2 * | 7/2025 | Gottwald | H10B 61/00 |
| 2011/0064969 | A1 | 3/2011 | Chen et al. | |
| 2012/0280336 | A1 | 11/2012 | Jan et al. | |
| 2013/0155754 | A1 | 6/2013 | Apalkov et al. | |
| 2014/0145792 | A1 | 5/2014 | Wang et al. | |
| 2015/0109853 | A1 | 4/2015 | Sato et al. | |
| 2015/0129993 | A1 | 5/2015 | Tang et al. | |
| 2015/0213869 | A1 | 7/2015 | Wu et al. | |
| 2015/0255135 | A1 | 9/2015 | Tran et al. | |
| 2016/0141333 | A1 | 5/2016 | Bandyopadhyay et al. | |

OTHER PUBLICATIONS

"High-Density and Low-Power Spin-Transfer-Torque MRAM with Perpendicular MTJs," Toshiba, accessed from https://www.toshiba.co.jp/rdc/rd/fileds/08_e06_e.htm on Mar. 7, 2018, 2 pp.
"Micron Steers Roadmap Around Memory Scaling Obstacles," accessed from https://www.hpcwire.com/2015/08/27/micron-steers-roadmap-through-memory-scaling-course/ on Aug. 27, 2015, 16 pp.
Alamdar et al., "Irradiation Effects on Perpendicular Anisotropy Spin-Orbit Torque Magnetic Tunnel Junctions", IEEE Transactions on Nuclear Science, vol. 68, No. 5, Mar. 15, 2021, pp. 665-670.
Almeida et al., "Quantitative Visualization of Thermally Enhanced Perpendicular Shape Anisotropy STT-MRAM Nanopillars", Nano Letters, vol. 10, May 25, 2022, 13 pp.
Alzate et al., "Voltage-Induced Switching of Nanoscale Magnetic Tunnel Junctions," International Electron Devices Meeting, Dec. 10-13, 2012, 4 pp.
Amiri et al., "Voltage-Controlled Magnetic Anisotropy in Spintronic Devices," World Scientific, vol. 2, No. 3, Oct. 29, 2012, 10 pp.
Apalkov et al., "Magnetoresistive Random Access Memory", Proceedings of the IEEE, vol. 104, No. 10, Aug. 29, 2016, pp. 1796-1830.
Avalanche Technology et al., "Avalanche Technology Announces Industry's First 1Gb STT-MRAM For Aerospace Applications", Cision PRWed, Jun. 14, 2021, 3 pp.
Bedau et al., "Spin-transfer pulse switching: From the dynamic to the thermally activated regime", arXiv:1009.5240v1, Sep. 27, 2010, 4 pp.
Bendra et al., "Spin Transfer Torques in Ultra-Scaled MRAM Cells", 2022 45th Jubilee International Convention on Information, Communication and Electronic Technology (MIPRO), May 23, 2022, pp. 154-157.
Bersweiler et al., "Magnetic and Free-Layer Properties of MgO/(Co)FeB/MgO Structures: Dependence on CoFeB Composition", IEEE Magnetics Letters, vol. 8, Sep. 4, 2017, 3 pp.
Bonell et al., "Large change in perpendicular magnetic anisotropy induced by an electric field in FePd ultrathin films," Applied Physics Letters, Jun. 9, 2011, 3 pp.
Brataas et al., "Current-induced torques in magnetic materials", Nature Materials, vol. 11, Apr. 23, 2012, p. 372-381.
Caçoilo et al., "Spin-Torque-Triggered Magnetization Reversal in Magnetic Tunnel Junctions with Perpendicular Shape Anisotropy", Physical Review Applied, vol. 16, Aug. 11, 2021, 8 pp.
Camsari et al., "Ultrafast Spin-Transfer-Torque Switching of Synthetic Ferrimagnets", arXiv:1606.04428v2, Jun. 15, 2016, 26 pp.
Carvello et al., "Sizable room-temperature magnetoresistance in cobalt based magnetic tunnel junctions with out-of-plane anisotropy", Applied Physics Letters, vol. 92, No. 10, Mar. 11, 2008, p. 3.
Chiba et al., "Electric-field control of magnetic domain-wall velocity in ultrathin cobalt with perpendicular magnetization," Nature Communications, Published Jun. 6, 2012, 7 pp.
Chiba et al., "Electrical control of the ferromagnetic phase transition in cobalt at room temperature," Nature Materials Oct. 2, 2011, 4 pp.
Chiu et al., "A 22 nm 4 Mb STT-MRAM data-encrypted near-memory computation macro with a 192GB/s read-and-decryption bandwidth and 25.1-55.1TOPS/W 8b MAC for AI Operations", 2022 IEEE International Solid-State Circuits Conference (ISSCC), Feb. 20, 2022, pp. 178-180.
Chiu et al., "Conduction mechanism of resistive switching films in MgO memory devices", Journal of Applied Physics, vol. 111, May 10, 2012, 5 pp.
Chun et al., "A Scaling Roadmap and Performance Evaluation of In-Plane and Perpendicular MTJ Based STT-MRAMs for High-Density Cache Memory", IEEE Journal of Solid-State Circuits, vol. 48, No. 2, Feb. 2013, pp. 598-610.
De Person et al., "Magnetic coupling between high magnetization perpendicular electrodes in an epitaxial FePt/MgO/FePt magnetic tunnel junction", Physical Review B, vol. 76, Nov. 1, 2007, pp. 184402-1-184402-8.
Duan et al., "Surface Magnetoelectric Effect in Ferromagnetic Metal Films," Physical Review Letters, Sep. 22, 2008, 4 pp.
Edwards et al., "Demonstration of narrow switching distributions in STTMRAM arrays for LLC applications at 1x nm node", 2020 IEEE International Electron Devices Meeting (IEDM), Dec. 12, 2020, pp. IEDM20-509-IEDM20-5012.
Enobio et al., "Evaluation of energy barrier of CoFeB/MgO magnetic tunnel junctions with perpendicular easy axis using retention time measurement", Japanese Journal of Applied Physics, vol. 57, No. 45, Mar. 13, 2018, 3 pp.
Fukami et al., "A spin-orbit torque switching scheme with collinear magnetic easy axis and current configuration", Nature Nanotechnology, vol. 11, Mar. 21, 2016, p. 621-625.
Fusil et al., "Magnetoelectric Devices for Spintronics," Annual Review of Materials Research, Mar. 21, 2014, 28 pp.
Gallagher et al., "22nm STT-MRAM for Reflow and Automotive Uses with High Yield, Reliability, and Magnetic Immunity and with Performance and Shielding Options", 2019 IEEE International Electron Devices Meeting (IEDM), Dec. 7, 2019, pp. IEDM19-42-IEDM19-45.
Gamble et al., "Electric Field Induced Magnetic Anisotropy in a Ferromagnet," Physical Review Letters, May 27, 2009, 4 pp.
Grimaldi et al., "Single-shot dynamics of spin-orbit torque and spin transfer torque switching in three-terminal magnetic tunnel junctions", nature nanotechnology, Jan. 27, 2020, 30 pp.
Han et al., "28-nm 0.08 mm2/Mb Embedded MRAM for Frame Buffer Memory", 2020 IEEE International Electron Devices Meeting (IEDM), Dec. 12, 2020, pp. IEDM20-215-IEDM20-218.
Haraguchi et al., Electric-field effects on magnetic anisotropy in Pd/Fe/Pd(001) surface, Journal of Physics D: Applied Physics, Feb. 6, 2011, 14 pp.
He et al., "First principles study of the electric field effect on magnetization and magnetic anisotropy of FeCo/MgO(001) thin film," American Institute of Physics, published online Aug. 17, 2011, 3 pp.
He et al., "Quadratic scaling of intrinsic Gilbert damping with spin-orbital coupling in L10 FePdPt films: Experiments and ab initio calculations", Physical Review Letters, vol. 110, Feb. 12, 2013, 5 pp.
Heinonen et al., "Perpendicular Spin Torque in Magnetic Tunnel Junctions," Physical Review Letters, Aug. 6, 2010, 4 pp.
Honjo et al., "25 nm iPMA-type Hexa-MTJ with solder reflow capability and endurance > 107 for eFlash-type MRAM", 2022 International Electron Devices Meeting (IEDM), Dec. 3, 2022, pp. 226-229.

(56) References Cited

OTHER PUBLICATIONS

Hosomi et al., "A Novel Nonvolatile Memory with Spin Torque Transfer Magnetization Switching: Spin-RAM", IEEE International Electron Devices Meeting, 2005. IEDM Technical Digest., Apr. 3, 2006, 4 pp.
Hu et al., "2X reduction of STT-MRAM switching current using double spin-torque magnetic tunnel junction", 2021 IEEE International Electron Devices Meeting (IEDM), Dec. 11, 2021, pp. IEDM21-43-IEDM21-46.
Hu et al., "STT-MRAM with double magnetic tunnel junctions", 2015 IEEE International Electron Devices Meeting (IEDM), Dec. 7, 2015, pp. IEDM15-668-IEDM15-671.
Hu et al., "The effect of oxygen vacancy on switching mechanism of ZnO resistive switching memory", Appl. Phys. Lett., vol. 110, No. 7, Feb. 13, 2017, 4pp.
Huang et al., "Temperature-dependent perpendicular anisotropy and Gilbert damping of L10-FePd films: Role of noble-metal buffer layers", Phys. Rev. Mater, vol. 6, Nov. 23, 2022, 21 pp.
Igarashi et al., "Single-nanometer CoFeB/MgO magnetic tunnel junctions with high-retention and high-speed capabilities", nature, Jan. 4, 2024, 9 pp.
Igarashi et al., "Temperature dependence of the energy barrier in X/1X nm shape-anisotropy magnetic tunnel junctions", Appl. Phys. Lett., vol. 118, No. 1, Jan. 4, 2021, 5 pp.
Iihama et al., "Influence of L10 order parameter on Gilbert damping constants for FePd thin films investigated by means of time-resolved magneto-optical Kerr effect", Physical Review B, vol. 94, Nov. 15, 2016, pp. 174425-1-174425-11.
Ikeda et al., "A perpendicular-anisotropy CoFeB—MgO magnetic tunnel junction", Nature Materials, vol. 9, Sep. 1, 2010, pp. 721-724.
Ikegawa et al., "High-Speed (400MB/s) and Low-BER STT-MRAM Technology for Industrial Applications", 2022 International Electron Devices Meeting (IEDM), Dec. 3, 2022, pp. 230-233.
Iwata-Harms et al., "Ultrathin perpendicular magnetic anisotropy CoFeB free layers for highly efficient, high speed writing in spin-transfer-torque magnetic random access memory", Scientific Reports, vol. 9, Dec. 19, 2019, 7 pp.
Jinnai et al., "Coherent magnetization reversal of a cylindrical nanomagnet in shape-anisotropy magnetic tunnel junctions", Appl. Phys. Lett, vol. 118, No. 8, Feb. 24, 2021, 5 pp.
Jinnai et al., "Fast Switching Down to 3.5 ns in Sub-5-nm Magnetic Tunnel Junctions Achieved by Engineering Relaxation Time", 2021 IEEE International Electron Devices Meeting (IEDM), Dec. 11, 2021, pp. IEDM21-47-IEDM21-50.
Jinnai et al., "High-Performance Shape-Anisotropy Magnetic Tunnel Junctions down to 2.3 nm", 2020 IEEE International Electron Devices Meeting (IEDM), Dec. 12, 2020, pp. IEDM20-517-IEDM20-520.
Jinnai et al., "Scaling magnetic tunnel junction down to single-digit nanometers—Challenges and prospects.", Appl. Phys. Lett., vol. 116, No. 16, Apr. 20, 2020, 7 pp.
Jung et al., "A crossbar array of magnetoresistive memory devices for in-memory computing", Nature, vol. 601, Jan. 12, 2022, p. 211-216.
Kanai et al., "Electric Field-Induced Magnetization Reversal in a Perpendicular-Anisotropy CoFeB—MgO Magnetic Tunnel Junction," Applied Physics Letters, Sep. 18, 2012, 3 pp.
Kanai et al., "Spintronics: from Basic Research to VLSI Application," AAPPS Bulletin, vol. 25, No. 1, Feb. 2015, 8 pp.
Kawahara et al., "Spin-transfer torque RAM technology: Review and prospect", Microelectronics Reliability, vol. 52, No. 4, Apr. 2012, p. 613-627.
Kent et al., "A new spin on magnetic memories", Nature Nanotechnology, vol. 10, Mar. 5, 2015, p. 187-191.
Kent et al., "Spin-transfer-induced precessional magnetization reversal", Applied Physics Letters, vol. 84, No. 19, Apr. 29, 2004, pp. 3897-3899.
Khanal et al., "Perpendicular magnetic tunnel junctions with multi-interface free layer", arXiv:2201.03798, Dec. 15, 2021, 14 pp.
Khvalkovskiy et al., "Basic principles of STT-MRAM cell operation in memory arrays", Journal of Physics D: Applied Physics, vol. 46, No. 7, Jan. 31, 2013, 35 pp.
Kim et al., "Tunneling magnetoresistance of magnetic tunnel junctions using perpendicular magnetization L10-CoPt electrodes", Applied Physics Letters, vol. 92, No. 17, Apr. 28, 2008, pp. 172502-1-172502-3.
Kishi et al., "Lower-current and fast switching of a perpendicular TMR for high speed and high density spin-transfer-torque MRAM", 2008 IEEE International Electron Devices Meeting, Dec. 15, 2008, 4 pp.
Kita et al., "Electric-field-control of magnetic anisotropy of Co0.6Fe0.2B0.2/oxide stacks using reduced voltage," Journal of Applied Physics, published online Aug. 14, 2012, 4 pp.
Klemmer et al., "Magnetic hardening and coercivity mechanisms in L10 ordered FePd ferromagnets", vol. 33, No. 10-, Dec. 1995, pp. 1793-1805.
Krizakova et al., "Field-free switching of magnetic tunnel junctions driven by spin-orbit torques at sub-ns timescales", arXiv:2006.06390v1, Jun. 11, 2020, 6 pp.
Lee et al., "1Gbit High Density Embedded STT-MRAM in 28nm FDSOI Technology", 2019 IEEE International Electron Devices Meeting (IEDM), Dec. 7, 2019, pp. IEDM19-22-IEDM19-25.
Lee et al., "28nm CIS-Compatible Embedded STT-MRAM for Frame Buffer Memory", 2021 IEEE International Electron Devices Meeting (IEDM), Dec. 11, 2021, pp. IEDM21-27-IEDM21-30.
Lee et al., "33.1 A 16nm 32Mb Embedded STT-MRAM with a 6ns Read-Access Time, a 1M-Cycle Write Endurance, 20-Year Retention at 150° C and MTJ-OTP Solutions for Magnetic Immunity", 2023 IEEE International Solid-State Circuits Conference (ISSCC), Feb. 19, 2023, pp. 494-496.
Lee et al., "Advanced MTJ Stack Engineering of STT-MRAM to Realize High Speed Applications", 2020 IEEE International Electron Devices Meeting (IEDM), Dec. 12, 2020, pp. IEDM20-231-IEDM20-234.
Lee et al., "Analytical investigation of spin-transfer dynamics using a perpendicular-to-plane polarizer", vol. 86, No. 2, Jan. 6, 2005, 1 pp.
Lequeux et al., "Thermal robustness of magnetic tunnel junctions with perpendicular shape anisotropy", Nanoscale, vol. 11, Feb. 17, 2020, pp. 6378-6384.
Li et al., "Perpendicular Spin Torques in Magnetic Tunnel Junctions," Physical Review Letters, Jun. 17, 2008, 4 pp.
Li et al., "Thermally assisted magnetization reversal in the presence of a spin-transfer torque", Physical Review B, Apr. 12, 2004, 6 pp.
Lihama et al., "Low precessional damping observed for L10-ordered FePd epitaxial thin films with large perpendicular magnetic anisotropy," Applied Physics Letters, American Institute of Physics, Oct. 10, 2014, 5 pp.
Liu et al., "Dynamics of spin torque switching in all-perpendicular spin valve nanopillars", Journal of Magnetism and Magnetic Materials, vol. 358-359, May 2014, pp. 233-258.
Lui et al., "Spin torque switching with the giant spin Hall effect of tantalum", Science, vol. 336, No. 6081, May 4, 2012, 31 pp.
Lyu et al., "FePd Single Layer and Synthetic Antiferromagnet with Low Damping and Crystalline Perpendicular Magnetic Anisotropy on Amorphous Si/SiO2 Wafers", 2023 IEEE International Magnetic Conference, May 15, 2023, 2 pp.
Lyu et al., "Ferromagnetic resonance and magnetization switching characteristics of perpendicular magnetic tunnel junctions with synthetic antiferromagnetic free layers", Applied Physics Letters, vol. 120, Jan. 4, 2022, 6 pp.
Lyu et al., "Sputtered L10-FePd and its Synthetic Antiferromagnet on Si/SiO2 Wafers for Scalable Spintronics", Advanced Functional Materials, vol. 33, Feb. 20, 2023, 10 pp.
Lyu et al., "Sub-ns Switching and Cryogenic-Temperature Performance of Mo-Based Perpendicular Magnetic Tunnel Junctions", IEEE Electron Device Letters, vol. 43, No. 8, Aug. 2022, pp. 1215-1218.
Mangin et al., "Current-induced magnetization reversal in nanopillars with perpendicular anisotropy", Nature Materials, vol. 5, Mar. 2006, pp. 210-215.

(56) References Cited

OTHER PUBLICATIONS

Matsukura et al., "Control of magnetism by Electric Fields," Nature Nanotechnology, Mar. 5, 2015, 12 pp.
Meng et al., "Spin transfer in nanomagnetic devices with perpendicular anisotropy", Applied Physics Letters, vol. 88, Apr. 26, 2006, pp. 172506-1-172506-3.
Meng-Chun et al., "Reliability study of perpendicular STT-MRAM as emerging embedded memory qualified for reflow soldering at 260oC", 2016 IEEE Symposium on VLSI Technology, Jun. 14, 2016, 2 pp.
Mihajlovic et al., "Origin of the resistance-area product dependence of spin transfer torque switching in perpendicular magnetic random access memory cells", arXiv:1905.02673v1, May 7, 2019, 6 pp.
Miron et al., "Perpendicular switching of a single ferromagnetic layer induced by in-plane current injection", Nature, vol. 476, Aug. 2011, pp. 189-194.
Naganuma et al., "Electrical Detection of Millimeter-Waves by Magnetic Tunnel Junctions Using Perpendicular Magnetized L10-FePd Free Layer", Nano Lett., vol. 15, No. 1, Dec. 30, 2014, pp. 623-628.
Naganuma et al., "Micromagnetic simulation of the temperature dependence of the switching energy barrier using string method assuming sidewall damages in perpendicular magnetized magnetic tunnel junctions", AIP Advances, vol. 10, Jul. 2, 2020, 7 pp.
Naganuma et al., "Unveiling a Chemisorbed Crystallographically Heterogeneous Graphene/L10-FePd Interface with a Robust and Perpendicular Orbital Moment", ASC Nano, vol. 16, Feb. 28, 2022, p. 4139-4151.
Naik et al., "JEDEC-Qualified Highly Reliable 22 nm FD-SOI Embedded MRAM For Low-Power Industrial-Grade, and Extended Performance Towards Automotive-Grade-1 Applications", 2020 IEEE International Electron Devices Meeting (IEDM), Dec. 12, 2020, pp. IEDM20-219-IEDM20-222.
Naik et al., "Manufacturable 22nm FD-SOI Embedded MRAM Technology for Industrial-grade MCU and IOT Applications", 2019 IEEE International Electron Devices Meeting (IEDM), Dec. 7, 2019, pp. IEDM19-26-IEDM19-29.
Nakamura et al., "Giant Modification of the Magnetocrystalline Anisotropy in Transition-Metal Monolayers by an External Electric Field," Physical Review Letters, May 5, 2009, 4 pp.
Nakayama et al., "Spin transfer switching in TbCoFe/CoFeB/MgO/CoFeB/TbCoFe magnetic tunnel junctions with perpendicular magnetic anisotropy", Applied Physics Letters, vol. 103, No. 7, Apr. 1, 2008, 3 pp.
Natsui et al., "12.1 An FPGA-Accelerated Fully Nonvolatile Microcontroller Unit for Sensor-Node Applications in 40nm CMOS/MTJ-Hybrid Technology Achieving 47.14μW Operation at 200MHz", 2019 IEEE International Solid-State Circuits Conference—(ISSCC), Feb. 17, 2019, pp. 202-204.
Negulyaev et al., "Electric Field as a Switching Tool for Magnetic States in Atomic-Scale Nanostructures," Physical Review Letters, Jan. 21, 2011, 4 pp.
Niranjan et al., "Electric Field effect on magnetization at the Fe/MgO(001) interface," Applied Physics Letters, published online Jun. 2, 2010, 3 pp.
Nishimura et al., "Magnetic tunnel junction device with perpendicular magnetization films for high-density magnetic random access memory", vol. 91, Apr. 15, 2002, p. 5246-5249.
Nishioka et al., "Novel Quad-Interface MTJ Technology and Its First Demonstration With High Thermal Stability Factor and Switching Efficiency for STT-MRAM Beyond 2X nm", IEEE Transactions on Electron Devices, Feb. 2020, 9 pp.
Nistor et al., "Pt/Co/oxide and oxide/Co/Pt electrodes for perpendicular magnetic tunnel junctions", Applied Physics Letters, vol. 94, Jan. 9, 2009, pp. 012512-1-012512-3.
Nozaki et al., "Electric-field-induced ferromagnetic resonance excitation in an ultrathin ferromagnetic metal layer," Nature Physics, published online Apr. 29, 2012, 6 pp.
Nozaki et al., "Voltage-induced perpendicular magnetic anisotropy change in magnetic tunnel junctions," Applied Physics Letters, Jan. 11, 2010, 3 pp.
Oka et al., "3D stacked CIS compatible 40 nm embedded STT-MRAM for buffer memory", 2021 Symposium on VLSI Technology, Jun. 13, 2021, 2 pp.
Okada et al., "Magnetization dynamics and its scattering mechanism in thin CoFeB films with interfacial anisotropy", Proceedings of the National Academy of Sciences, vol. 114, No. 15, Mar. 2017, 23 pp.
Ong et al., Electric field control and effect of Pd capping on magnetocrystalline anisotropy in FePd thin films: A first-principles study, Physical Review, published online Mar. 24, 2014, 8 pp.
Peng et al., "Interfacial Perpendicular Magnetic Anisotropy in Sub-20 nm Tunnel Junctions for Large-Capacity Spin-Transfer Torque Magnetic Random-Access Memory", IEEE Magnetics Letters, vol. 8, Apr. 12, 2017, 5 pp.
Perrissin et al., "Highly thermally stable sub-20nm magnetic random-access memory based on perpendicular shape anisotropy", Nanoscale, vol. 10, May 18, 2018, 15 pp.
Perrissin et al., "Spin transfer torque magnetic random-access memory: towards sub-10 nm devices", 2018 International Conference on IC Design & Technology (ICICDT), Jun. 4, 2018, pp. 125-128.
Raymenants et al., "Nanoscale domain wall devices with magnetic tunnel junction read and write", Nature Electronics, vol. 4, Jun. 23, 2021, pp. 392-398.
Saino et al., "Write-error rate of nanoscale magnetic tunnel junctions in the precessional regime", Appl. Phys. Lett., vol. 115, No. 14, Sep. 30, 2019, 5 pp.
Santos et al., "Ultrathin perpendicular free layers for lowering the switching current in STT-MRAM", arXiv:2008.01343v1, Aug. 4, 2020, 6 pp.
Sato et al., "Perpendicular-anisotropy CoFeB—MgO magnetic tunnel junctions with a MgO/CoFeB/Ta/CoFeB/MgO recording structure", Appl. Phys. Lett., vol. 101, Jul. 13, 2012, 4 pp.
Sato et al., "Properties of magnetic tunnel junctions with a MgO/CoFeB/Ta/CoFeB/MgO recording structure down to junction diameter of 11 nm", Appl. Phys. Lett., vol. 105, No. 6, Aug. 13, 2014, 4 pp.
Sato et al., "Two-terminal spin-orbit torque magnetoresistive random access memory", arXiv:1806.09713v2, Sep. 13, 2018, 21 pp.
Schulman et al., "Exploring Multifunctionality in MgO-Based Magnetic Tunnel Junctions with Coexisting Magnetoresistance and Memristive Properties", Advanced Functional Materials, vol. 33, No. 46, Nov. 9, 2023, 9 pp.
Seki et al., "Coercivity change in an FePt thin layer in a Hall device by voltage application," Applied Physics Letters, published online May 24, 2011, 3 pp.
Seo et al., "First demonstration of full integration and characterization of 4F2 1SIM cells with 45 nm of pitch and 20 nm of MTJ size", 2022 International Electron Devices Meeting (IEDM), Dec. 3, 2022, pp. 218-221.
Shih et al., "A Reflow-capable, Embedded 8 Mb STT-MRAM Macro with 9nS Read Access Time in 16 nm FinFET Logic CMOS Process", 2020 IEEE International Electron Devices Meeting (IEDM), Dec. 12, 2020, pp. IEDM20-223-IEDM20-226.
Shiota et al., "Induction of coherent magnetization switching in a few atomic layers of FeCo using voltage pulses," Nature Materials, vol. 11, published online Nov. 13, 2011, 5 pp.
Sun, "Spin-current interaction with a monodomain magnetic body: A model study", Physical Review B, vol. 62, No. 1, Jul. 1, 2000, pp. 570-578.
Sun, "Spin-transfer torque switched magnetic tunnel junction for memory technologies", Journal of Magnetism and Magnetic Materials, vol. 559, Oct. 1, 2022, 12 pp.
Suzuki et al., "Dependence of the Growth Mode in Epitaxial FePt Films on Surface Free Energy", ACS applied materials & interfaces, vol. 13, No. 14, Mar. 31, 2021, pp. 16620-16627.
Tadisina et al., "Magnetic tunnel junctions with Co-based perpendicular magnetic anisotropy multilayers", vol. 28, No. 4, Jul. 2010, p. 973-978.

(56) References Cited

OTHER PUBLICATIONS

Takeuchi et al., "Nanometer-thin L 1 0 -MnAl film with B 2-CoAl underlayer for high-speed and high-density STT-MRAM: Structure and magnetic properties", Applied Physics Letters, vol. 120, No. 5, Jan. 2022, 5 pp.
Teixeira et al., "Electroforming, magnetic and resistive switching in MgO-based tunnel junctions", Journal of Physics D: Applied Physics, vol. 42, No. 10, Apr. 28, 2009, 4 pp.
Tsujikawa et al., "A comparative ab initio study on electric-field dependence of magnetic anisotropy in MgO/Fe/Pt and MgO/Fe/Au films," Journal of Applied Physics, Mar. 22, 2011, 3 pp.
Tsujikawa et al., "Finite Electric Field Effects in the Large Perpendicular Magnetic Anisotropy Surface Pt/Fe/Pt(001): A First-Principles Study," Physical Review Letters, Jun. 18, 2009, 4 pp.
Wang et al., "22 nm Embedded STT-MRAM Macro with 10 ns Switching and >1014 Endurance for Last Level Cache Applications", 2021 Symposium on VLSI Technology, Jun. 13, 2021, 2 pp.
Wang et al., "Atomic-Scale Structure and Local Chemistry of CoFeB—MgO Magnetic Tunnel Junctions", Nano Lett., vol. 16, No. 3, Feb. 23, 2016, pp. 1530-1536.
Wang et al., "Buffer layer engineering of Ll FePd thin films with large perpendicular magnetic anisotropy", AIP Advances, vol. 11, Feb. 3, 2021, pp. 025106-1-025106-6.
Wang et al., "Current-induced magnetization switching in atom-thick tungsten engineered perpendicular magnetic tunnel junctions with large tunnel magnetoresistance", Nature Communications, vol. 9, Feb. 14, 2018, 7 pp.
Wang et al., "Electric-field-assisted switching in magnetic tunnel junctions," Nature Materials, vol. 11, published online Nov. 13, 2011, 5 pp.
Wang et al., "Invited: A Pathway to Enable Exponential Scaling for the Beyond-CMOS Era", DAC '17: Proceedings of the 54th Annual Design Automation Conference 2017, Jun. 2017, 6 pp.
Wang et al., "Low-power non-volatile spintronic memory: STT-RAM and beyond," Journal of Applied Physics, published online Jan. 31, 2013, 11 pp.
Watanabe et al., "Shape anisotropy revisited in single-digit nanometer magnetic tunnel junctions", vol. 9, No. 663, Feb. 14, 2018, 6 pp.
Weisheit et al., "Electric Field-Induced Modification of Magnetism in Thin-Film Ferromagnets," uploaded to ScienceMag.org, 1136629, Jan. 2007, 3 pp.
Yakushiji et al., "Ultrathin Co/Pt and Co/Pd superlattice films for MgO-based perpendicular magnetic tunnel junctions", Applied Physics Letters, vol. 97, No. 23, Dec. 6, 2010, 3 pp.
Yang et al., "Domain-wall velocities of up to 750 m s-1 driven by exchange-coupling torque in synthetic antiferromagnets", Nature Nanotechnology, vol. 10, No. 3, Feb. 23, 2015, 6 pp.
Yang et al., "Observation of conducting filament growth in nanoscale resistive memories", Nature Communications, vol. 3, Mar. 13, 2012, 8 pp.
Ye et al., "Magnetic properties of MgO-based RE-TM perpendicular magnetic tunnel junctions", Journal of Magnetism and Magnetic Materials, vol. 322, No. 7, Apr. 2010, pp. L9-L11.
Yoshida et al., "Enhanced Thermal Stability in Perpendicular Top-Pinned Magnetic Tunnel Junction With Synthetic Antiferromagnetic Free Layers", IEEE Transactions on Magnetics, vol. 49, No. 7, Jul. 15, 2013, pp. 4363-4366.
Zepeda-Ruiz et al., "Effects of ion beams on the early stages of MgO growth", J. Appl. Phys., vol. 91, No. 12, Jun. 15, 2002, pp. 10169-10180.
Zhang et al., "Bipolar Electric-Field Switching of Perpendicular Magnetic Tunnel Junctions through Voltage-Controlled Exchange Coupling", Nano Lett., Jan. 4, 2022, p. 622-629.
Zhang et al., "Development of Perpendicular Magnetic Tunnel Junctions with FePd free layers for memory and logic applications," Poster submitted to Semiconductor Research Corporation, p. 089487, Oct. 6, 2016, 1 pp.
Zhang et al., "Enhancement of tunneling magnetoresistance by inserting a diffusion barrier in L10-FePd perpendicular magnetic tunnel junctions", Applied Physics Letters, vol. 112, Apr. 9, 2018, 5 pp.
Zhang et al., "Enhancement of tunneling magnetoresistance by inserting a diffusion barrier in L10-FePd perpendicular magnetic tunnel junctions," Semiconductor Research Corporation, p. 089945, Dec. 14, 2016, 17 pp.
Zhang et al., "Field-free and sub-ns magnetization switching of magnetic tunnel junctions by combining spin-transfer torque and spin-orbit torque", Appl. Phys. Lett., vol. 118, Mar. 1, 2021, 5 pp.
Zhang et al., "L10-FePd Synthetic Antiferromagnet Through a Face-centered-cubic Ruthenium Spacer Utilized for Perpendicular Magnetic Tunnel Junctions", Physical Review Applied, Apr. 19, 2018, 24 pp.
Zhang et al., "Model of orbital populations for voltage-controlled magnetic anisotropy in transition-metal thin films", Physical Review B, vol. 96, Jul. 28, 2017, 8 pp.
Zhao, "Spin Transfer Torque Induced Switching in Magnetic Tunnel Junction For Stt-Ram Application", Magnetic Tunnel Junction For STT-RAM Application, Dec. 2013, 147 pp.
Zhernenkov et al., "Electric-field modification of magnetism in a thin CoPd film," Physical Review B, Jul. 20, 2010, 6 pp.
Zink et al., "Ultralow Current Switching of Synthetic-Antiferromagnetic Magnetic Tunnel Junctions Via Electric-Field Assisted by Spin-Orbit Torque", Advanced Electronic Materials, vol. 8, No. 10, Oct. 2022, 7 pp.

* cited by examiner

FePd
FePd

Perp.
In-plane
Control sample
Perp.
In-plane
$M/M_S$
$\mu_0 H_{ext}$ (T)

4 K
300 K
400 K
Normalized $R_{AH}$
$\mu_0 H_{ext}$ (T)

Pump
Probe

TR-MOKE signal (arb. units)
Time delay (ps)

Experiment
Fitting
f (GHz)
0.0 0.5 1.0 1.5 2.0 2.5 3.0

K (r.l.u.)
FePd (001)
Pt (002)
FePd (002)
Cr (002)
L (r.l.u.)

Cr (002)
FePd (002)
Pt (002)
FePd (001)
L (r.l.u.)
H (r.l.u.)
K (r.l.u.)

XRD signal (arb. unit)
FePd (001)
Pt (002)
FePd (002)
Cr (002)
2θ (degree)

Sample index
12
11
10
9
8
7
Perp.
6
5
4
3
2
1
M/Ms
$\mu_0 H_{ext}$ (T)

In-plane
M/Ms
$\mu_0 H_{ext}$ (T)

HF mode
LF mode
f (GHz)
$\mu_0 H_{ext}$ (T)

$-J_{ex}$ (mJ m$^{-2}$)
$t_{Ir}$ (nm)
Ir
$M_1$
$\theta_{M1}$
$M_2$
$\theta_{M2}$

SCALABLE SPINTRONIC DEVICES FORMED ON SILICON WAFERS

This application claims the benefit of U.S. Provisional Patent Application No. 63/483,667, filed 7 Feb. 2023, the entire contents of which is incorporated herein by reference.

GOVERNMENT INTEREST

This invention was made with government support under 70NANB22H075 awarded by the National Institute of Standards and Technology, and FA8650-18-2-7868 awarded by the Department of the Air Force, and HR0011-17-S-0056-FP042 awarded by the Defense Advanced Research Projects Agency. The government has certain rights in the invention.

BACKGROUND

With the advent of mobile and handheld electronic devices, the demand for much smaller, faster and ultra-low power systems keeps growing. The increasing density of complementary memories has caused significant increases in static and dynamic power consumption in electronic devices.

SUMMARY

In some examples, the disclosure is directed to a device which includes a silicon wafer substrate, a seed layer formed on a surface of the silicon wafer substrate, a dual buffer layer (bilayer buffer or bridge layer), and a ferromagnetic layer exhibiting crystalline perpendicular magnetic anisotropy ("PMA structure") formed on the bilayer buffer ("bridge layer"). The PMA structure includes at least one of iron-palladium (FePd) alloy, iron-platinum alloy (FePt), or iron-platinum-palladium alloy ($Fe(Pt_xPd_{(1-x)})$, and may include a synthetic antiferromagnetic ("SAF") structure, in which plural FePd, FePt, or $Fe(Pt_xPd_{(1-x)})$ layers antiferromagnetically coupled through a spacing layer.

In some examples, the disclosure is directed to a technique which includes receiving a silicon wafer substrate. The technique also includes forming a seed layer on a surface of the silicon wafer substrate. Additionally, the technique includes forming a PMA structure on the seed layer. The PMA structure includes at least one of iron-palladium (FePd) alloy, iron-platinum alloy (FePt), or iron-platinum-palladium alloy ($Fe(Pt_xPd_{(1-x)})$).

In some examples, the disclosure is directed to a spin-orbit torque (SOT) MRAM device or a logic device. The device includes a silicon wafer substrate, a seed layer formed on a surface of the silicon wafer substrate, a perpendicular magnetic anisotropy (PMA) structure exhibiting crystalline PMA formed on the seed layer, wherein the PMA structure comprises at least one of iron-palladium alloy (FePd), iron-platinum alloy (FePt), or iron-platinum-palladium alloy ($Fe(Pt_xPd_{(1-x)})$), a magnetic tunnel junction (MTJ) structure including a MgO tunnel barrier, a hard perpendicular magnetic anisotropy (PMA) layer with a pinned magnetization orientation, and a soft PMA layer with a settable magnetization orientation. Additionally, in some examples, the device includes a bridge layer between the MTJ structure and the FePd, FePt, or $Fe(Pt_xPd_{(1-x)})$ layer.

In some examples, the disclosure is directed to a device which includes a silicon wafer substrate with pre-patterned transistors structures and metal layers including a top metal layer, a seed layer formed on a surface of the top metal layer, and a perpendicular magnetic anisotropy (PMA) structure exhibiting crystalline PMA formed on the seed layer. The PMA structure comprises at least one of iron-palladium (FePd) alloy, iron-platinum alloy (FePt), or iron-platinum-palladium alloy ($Fe(Pt_xPd_{(1-x)})$).

The details of one or more examples are set forth in the accompanying drawings and the description below. Other features, objects, and advantages will be apparent from the description and drawings, and from the claims.

BRIEF DESCRIPTION OF DRAWINGS

FIGS. 1A and 1B respectively plot the thermal stability of conventional PMA material (Co—Fe—B alloy) and Fe—Pd alloy.

DETAILED DESCRIPTION

Figures 1A, 1B:
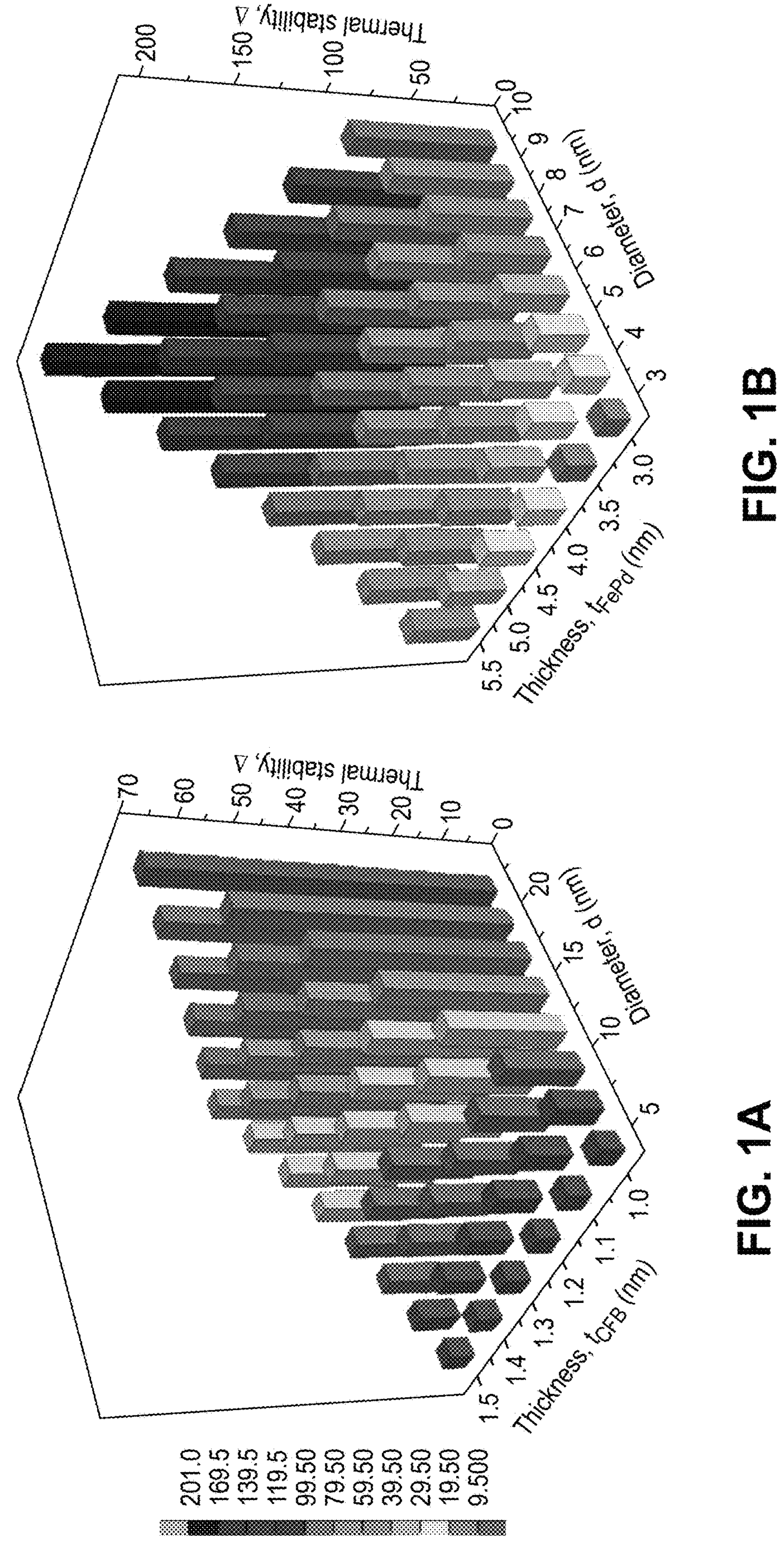
FIG. 1A-1B are charts comparing thermal stability scales as a function of PMA structure thickness and device diameter.

Materials and layered structures that possess perpendicular magnetic anisotropy (PMA) have drawn significant interest in both applied and fundamental research within magnetism and spintronics for the past two decades. Due to their promised advantages (e.g., scalability, speed, energy dissipation, etc.) over in-plane counterparts, PMA materials including rare earth-transition metal (RE-TM) compounds, Co (or CoFe)-based multilayers, and $L1_0$-phase alloys were widely investigated as potential material choices for future memory and logic devices until the 2010s. Unfortunately, they either lack the tolerance to required thermal treatments (e.g., the 400° C. annealing in back-end-of-line semiconductor processes), suffer from large Gilbert damping (α), or otherwise require epitaxy with substrate materials incompatible with monolithic semiconductor integration. In contrast, as-deposited CoFeB is amorphous and can crystalize during post-annealing by solid-state epitaxy (SSE), forming sharp CoFe(B)—MgO interfaces and enabling giant tunnel magnetoresistance (TMR). Thus, the CoFeB/MgO system quickly became the mainstream after the discovery of its interfacial PMA in 2010, and CoFeB/MgO systems dominated the development of perpendicular-magnetic tunnel junctions (p-MTJs) in the last decade. However, CoFeB/MgO systems suffer from drawbacks including weak interfacial PMA ($K_{i,CFB}$~1.5 mJ $m^{-2}$), which may limit the thickness (t) of CoFeB to ~1.3 nm. As p-MTJ size (diameter, d) entered a single-digit nm era, the combination of small $t_{CFB}$ and d, as shown in FIG. 1A, leads to insufficient thermal stability (Δ) of below 20 and directly restricts the nonvolatility of p-MTJ devices. FIG. 1A illustrates the thermal stability of CoFeB. In the t regime where interfacial PMA makes CoFeB perpendicularly magnetized ($t_{CFB}$~1.3 nm), Δ is always less than 20 at d≤10 nm. To make CoFeB-based p-MTJs more scalable, additional efforts like utilizing shape anisotropy (t≥10 nm) and creating multiple (Co)FeB—MgO interfaces have to be taken, which significantly increases switching current density (J, proportional to t) and stack complexity.

This disclosure describes example techniques to accompany the continued shrinking down of nanoscale spintronic devices that may overcome issues described above. However, the techniques described in this disclosure should not be considered limited to overcoming the issues described above.

$L1_0$-FePd manifests strong bulk PMA of $K_{b,FePd}$~1.7 MJ $m^{-3}$ and thus, exhibits excellent scalability. As shown in FIG. 1B, Δ=60 that corresponds to ~10 year data retention can be reached at d=5 nm with a moderate $t_{FePd}$~5 nm. As a free layer material, $L1_0$-FePd may be applied in full p-MTJs and read sensor-type MTJs (with in-plane reference layer), in which a projected TMR up to 85% may be realized. FIG. 1B illustrates the thermal stability of $L1_0$-FePd. Due to its strong bulk, PMA, $L1_0$-FePd can sustain 4 of exceeding 60 at a moderate $t_{FePd}$~5 nm while downscaling to d=5 nm. The parameters of CoFeB and $L1_0$-FePd are assumed to be $K_{i,CFB}$=1.5 mJ $m^{-2}$, $K_{b,FePd}$=1.7 MJ $m^{-3}$, and saturation magnetization $M_{S,CFB}$=1.2 MA $m^{-1}$ and $M_{S,FePd}$=1.1 MA $m^{-1}$, respectively. Devices which include an $L1_0$-FePd free layer may provide unforeseen energy efficiency in bipolar electric-field switched FePd p-MTJs through voltage-controlled exchange coupling. A free layer may be a layer within a device that has a configurable magnetization state. Such devices may achieve an ultralow J~$1.1\times10^5$ A $cm^{-2}$. In one or more examples, the chemisorption-type van der Waals force and robust interfacial PMA of FePd-Graphene interface may provide benefits from integrating FePd-based spintronic devices with 2D materials. Additionally, the low α of FePd may outperform those of RE-TM compounds, Co (or CoFe)-based multilayers, and many other $L1_0$-alloys (e.g., $L1_0$-FePt). As such, FePd alloys may be highly desirable for device applications because J is proportional to α. Example devices and magnetic structures which include FePd composite free layers are the subject of U.S. Pat. No. 10,546,997 B2 to Wang et al., the entire contents of which is incorporated herein in entirety.

Despite the advantages of $L1_0$-FePd, its PMA and damping depend on the crystallinity of $L1_0$ phase and (001) texture. In order to seed a strong (001)-textured $L1_0$ order, only a few special substrates, such as MgO(001) and $SrTiO_3$ (001), may be suitable for $L1_0$-FePd growth. These substrates are costly, hard to obtain in large sizes, and most severely, incompatible to the monolithic integration with semiconductor microelectronics. As a result, applying $L1_0$-FePd to extend the scalability of spintronic devices may present challenges.

In devices and techniques according to the present disclosure, it is demonstrated that synthesizing $L1_0$-FePd with (001) texture on industry-ready thermally-oxidized Si wafers by magnetron sputtering may be accomplished. Example devices are disclosed, which have been characterized by vibrating-sample magnetometry (VSM) and ultrafast time-resolved magneto-optical Kerr effect (TR-MOKE) metrology. The example devices exhibit strong PMA with full out-of-plane remanence ($M_r$), high in-plane saturation field ($H_S$), as well as low α. X-ray diffraction (XRD) measurements confirm the $L1_0$ phase and strong (001) texture. In some examples, the $L1_0$-FePd(001) texture is induced by a (001)-textured MgO seed layer, which was prepared by industry-compatible radio-frequency (RF) magnetron sputtering at room temperature on the amorphous $SiO_2$ surface. Atomic-resolution scanning transmission electron microscopy (STEM) reveals the epitaxial growth of buffer layer (001)/$L1_0$-FePd(001) on MgO(001). Given that MgO is part of the general techniques using p-MTJ material systems, this disclosure provides an accessible pathway to enable deeply-scalable spintronic applications. Moreover, in some examples, devices are disclosed which include perpendicular-synthetic antiferromagnets (p-SAFs) that include two $L1_0$-FePd layers antiferromagnetically coupled through an Ir spacer, although other types of spacers may be possible. In some examples, the Ir-spaced FePd p-SAFs prepared on Si/$SiO_2$ wafers exhibit very large interlayer exchange coupling (IEC, $-J_{ex}$), up to ~34% higher than the Ru-spaced p-SAF on MgO(001) substrates. As p-SAFs have been experimentally demonstrated to perform better than uniform ferromagnets with faster speed, higher 4, as well as lower J, this result further exhibits one or more examples of the technological potential of devices according to the present disclosure.

Figures 2A, 2B, 2C, 2D:
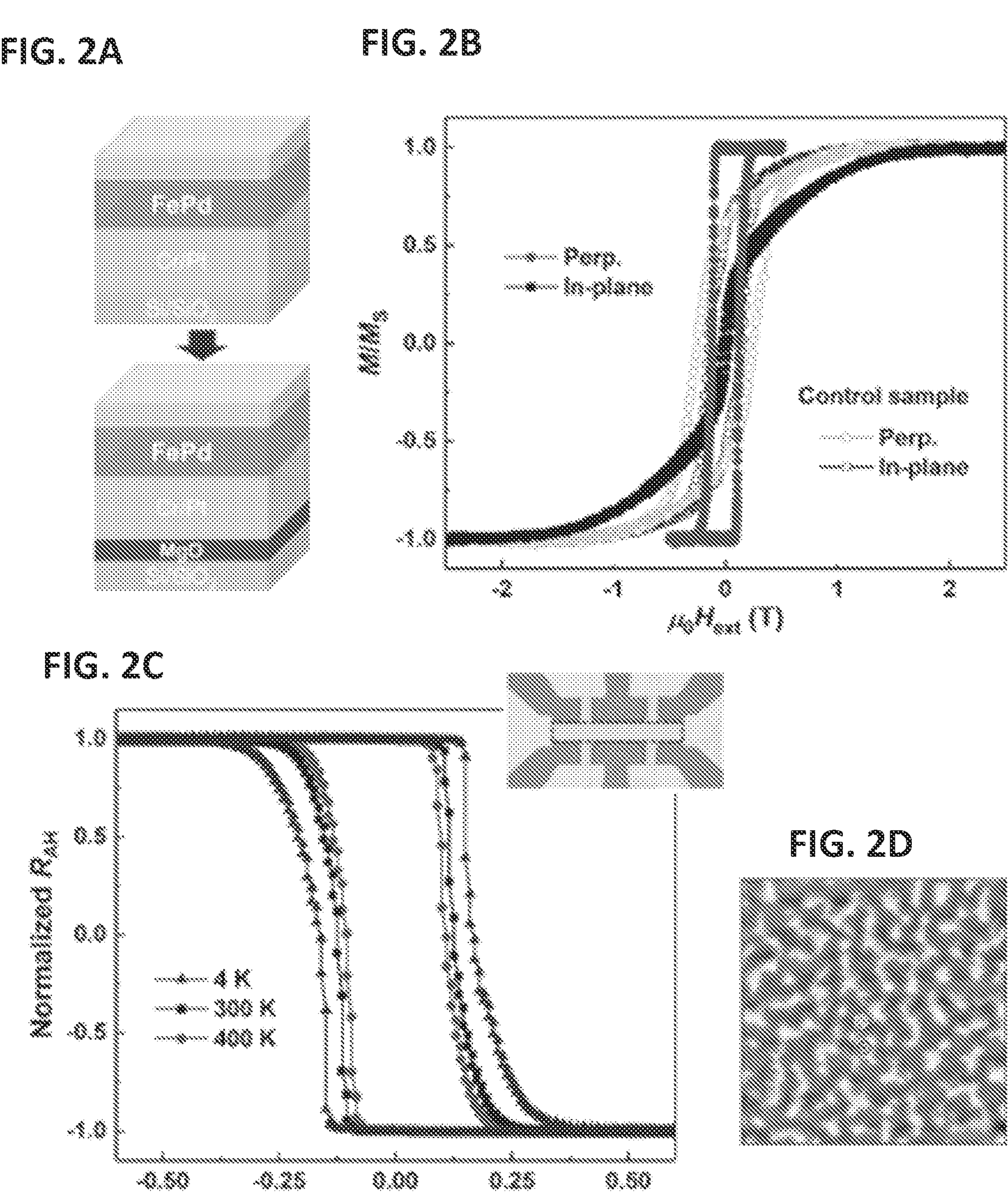
FIG. 2A illustrates a schematic stack structure of example devices with and without a seed layer.
FIG. 2B is a chart illustrating hysteresis loops of (001)-textured $L1_0$-FePd (solid symbols) and the control sample (empty symbols).
FIG. 2C is a chart illustrating $R_{AH}$-$H_{ext}$ loops collected from a 10×78 $\mu m^2$ Hall bar device at different temperatures. Inset: An optical microscopy image of the device. The Hall bar channel is labelled by black dashed line.
FIG. 2D is an MFM image of a 5×5 $\mu m^2$ portion of the (001)-textured $L1_0$-FePd, where the markers indicate the direction of local magnetization.

An example device according to the present disclosure is illustrated in FIG. 2A. Stack structure of the samples with (bottom) and without (top) the MgO seed layer. The one without the MgO seed layer served as a control sample. The stacks containing a Cr/Pt bilayer buffer and the FePd layer were direct-current magnetron sputtered onto Si(001)/$SiO_2$ (300 nm, thermally oxidized) wafers with/without an RF sputtered MgO seed layer, followed by a capping layer. In some examples, the Cr buffer is an example of a bridge layer, and the Pt buffer is another example of a bridge layer, and in some cases, may be formed together and referred to as a bridge layer. Other examples of bridge layers are possible. Except for the 5 nm MgO that was deposited in an auxiliary chamber (Oerlikon Leybold Vacuum UNIVEX MULTI-CHAMBER, base vacuum better than $3\times10^{-9}$ Torr) at room temperature, all the layers were prepared in a custom ultra-high vacuum chamber with base pressure better than $5\times10^{-}$ 10 Torr. Before the deposition of Cr, the MgO-coated wafers were baked at 600° C. for 1 h in vacuum and held for an additional 0.5 h in an 0.8 mTorr $N_2$ environment to heal any oxygen vacancies known to form on the surface of MgO during vacuum annealing. The Cr(30 nm)/Pt(4 nm) buffer and 8 nm FePd layer were grown at 350° C. with a 10 min in-situ anneal at 600° C. performed after the Cr layer deposition for stress relief. Finally, a Ru (2 nm)/Ta (3 nm) capping layer was grown after cooling the substrate down to room temperature. The sputtering was at Ar pressure of 2 mTorr, 3 mTorr, and 6 mTorr for MgO, Cr/Pt, and FePd, respectively.

The magnetization (M)-external field ($H_{ext}$) hysteresis loops of FePd layers were measured by VSM and plotted in FIG. 2B. Despite the amorphous $SiO_2$ surface, FePd shows strong PMA with $M_r = M_S$ and $\mu_0 H_S \sim 2$ T with the insertion of MgO seed layer, indicating its (001)-textured $L1_0$ phase. By integrating over the in-plane curve, the uniaxial anisotropy energy density ($K_u$) is estimated to be 1.13 MJ $m^{-3}$, about 60% higher than the case of (Mn—Cr)AlGe and comparable with results of FePd formed on MgO(001) or $SrTiO_3$ (001) substrates. Compared with efforts such as crystalizing FePdB by SSE, performing long-time annealing in $H_2$, precisely controlling the heating rate, trying various buffers, and alloying FePd with Cu, the example device was formed using a deliberately uncomplicated technique and uniquely achieves distinct PMA of FePd with amorphous substrates. The control sample (i.e., without the MgO seed layer) shows a significant in-plane component of the easy axis. As the PMA follows the orientation of the (001)-textured $L1_0$ phase, the VSM measurements imply that the MgO seed layer is key to engineer the correct FePd microstructure. To further explore its application potential, the PMA FePd was patterned into Hall bar devices by using photolithography and $Ar^+$ ion milling. Top-contact pads made of Ti (10 nm)/Au (100 nm) were fabricated by E-beam evaporation and a lift-off process. The $H_{ext}$-dependence of anomalous Hall resistance ($R_{AH}$) and device geometry are presented in FIG. 2C and its inset, respectively. The $R_{AH}$-$H_{ext}$ loops collected from a cryogenic temperature of 4 K to a high temperature of 400 K show that FePd maintains its PMA in a wide temperature range. FePd-based spintronic devices, as a result, manifest a broad application prospect from superconducting circuits (~4 K) to automotive grade-1 products (−40° C. to 125° C.). FIG. 2D presents a magnetic force microscopy (MFM) image of the MgO-seeded FePd film in the demagnetized state, showing the labyrinth domain structure typical of perpendicularly magnetized films. The observed sub-micron magnetic domain size is comparable to those observed in FePd films grown on MgO(001) substrates.

The magnetic characteristics of example PMA structures was further investigated. TR-MOKE measurements were conducted on the $L1_0$-FePd(001) thin film, and the results are illustrated schematically as shown in FIG. 3A, where $\theta_H$ and $\theta_M$ respectively denote the direction of $H_{ext}$ and resulted equilibrium angle of M.

Figures 3A, 3B, 3C:
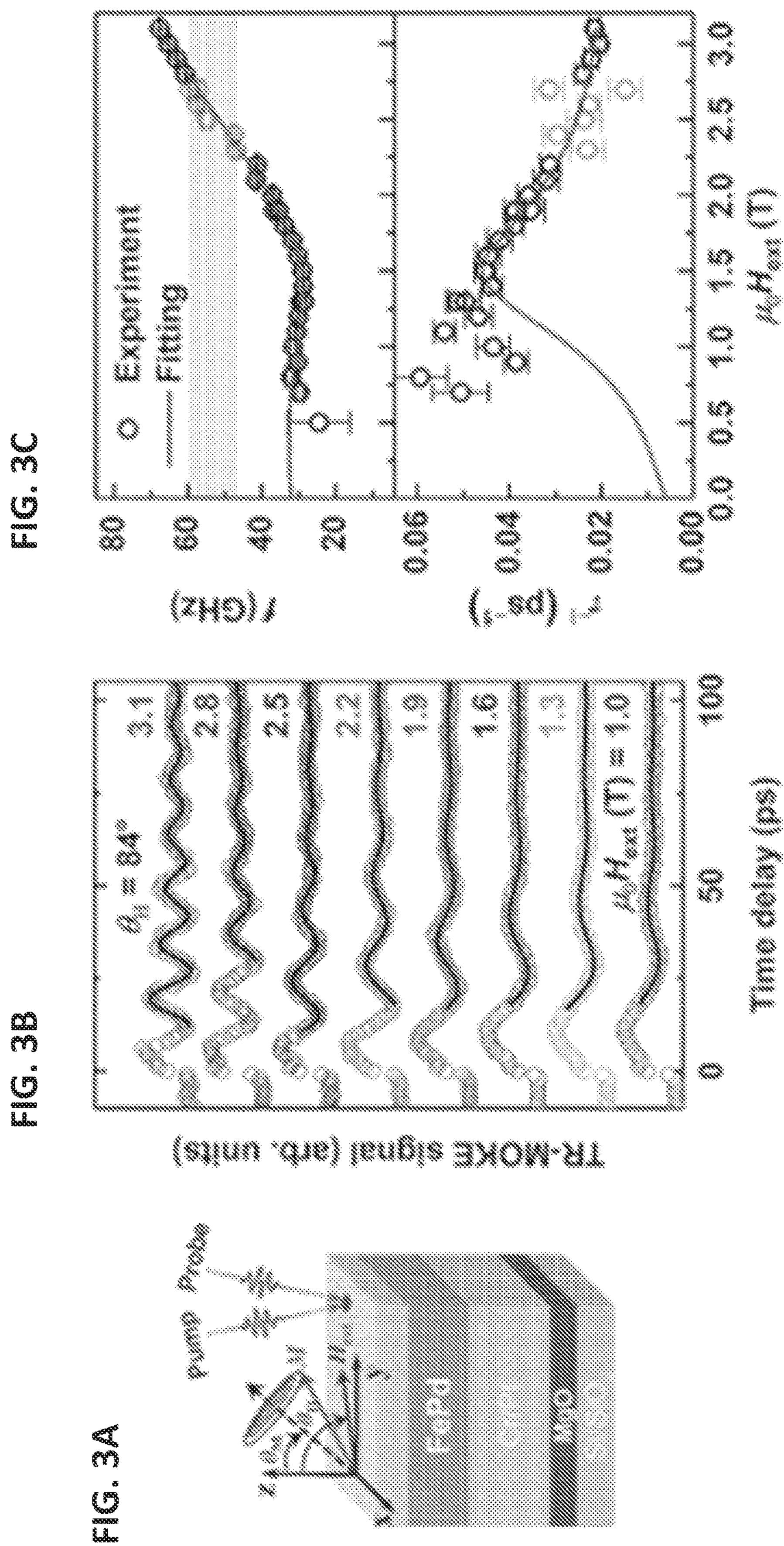
FIG. 3A is a schematic illustration of the TR-MOKE measurements performed on an $L1_0$-FePd(001) example PMA structure according to the present disclosure.
FIG. 3B is a chart illustrating TR-MOKE signals, which reflect the damped precession of M induced by laser excitation, as functions of time delay.
FIG. 3C is a chart illustrating extracted f (top panel) and $\tau^{-1}$ (bottom panel) vs. $\mu_0 H_{ext}$.

A representative set of TR-MOKE signals and associated fitting results are plotted in FIG. 3B as functions of the time delay between pump excitation and probe sensing. The experimental data and fitting curves are marked by circles and lines, respectively. The experiments are conducted under $\mu_0 H_{ext}$ ranging from 1.0 to 3.1 T along $\theta_H = 84°$ deviating from the surface normal. Here, $\theta_H = 84°$ was chosen to balance the needs for precessional signal amplitudes and the measurement sensitivity to a. FIG. 3C summarizes the corresponding precession frequency (f, top panel) and relaxation time (t, bottom panel) that are extracted from the damped magnetization oscillation observed in experiments. The best fits of field-dependent f and $\tau^{-1}$ yield $\mu_0 H_k = 1.33 \pm 0.06$ T and $\alpha = 0.012 \pm 0.007$. Due to the spin-strain coupling, translucent data points (highlighted region) are excluded from the fitting. The translucent data points are excluded from fitting to avoid the influence of the laser-induced acoustic waves (~56 GHz±3 GHz measured with the time-domain thermoreflectance technique) via spin-strain coupling. At low fields ($\mu_0 H_{ext} < 1.4$ T), the measured $\tau$ deviate markedly from the model fit, which can be explained by the low-field loss.

Figures 4A, 4B, 4C:
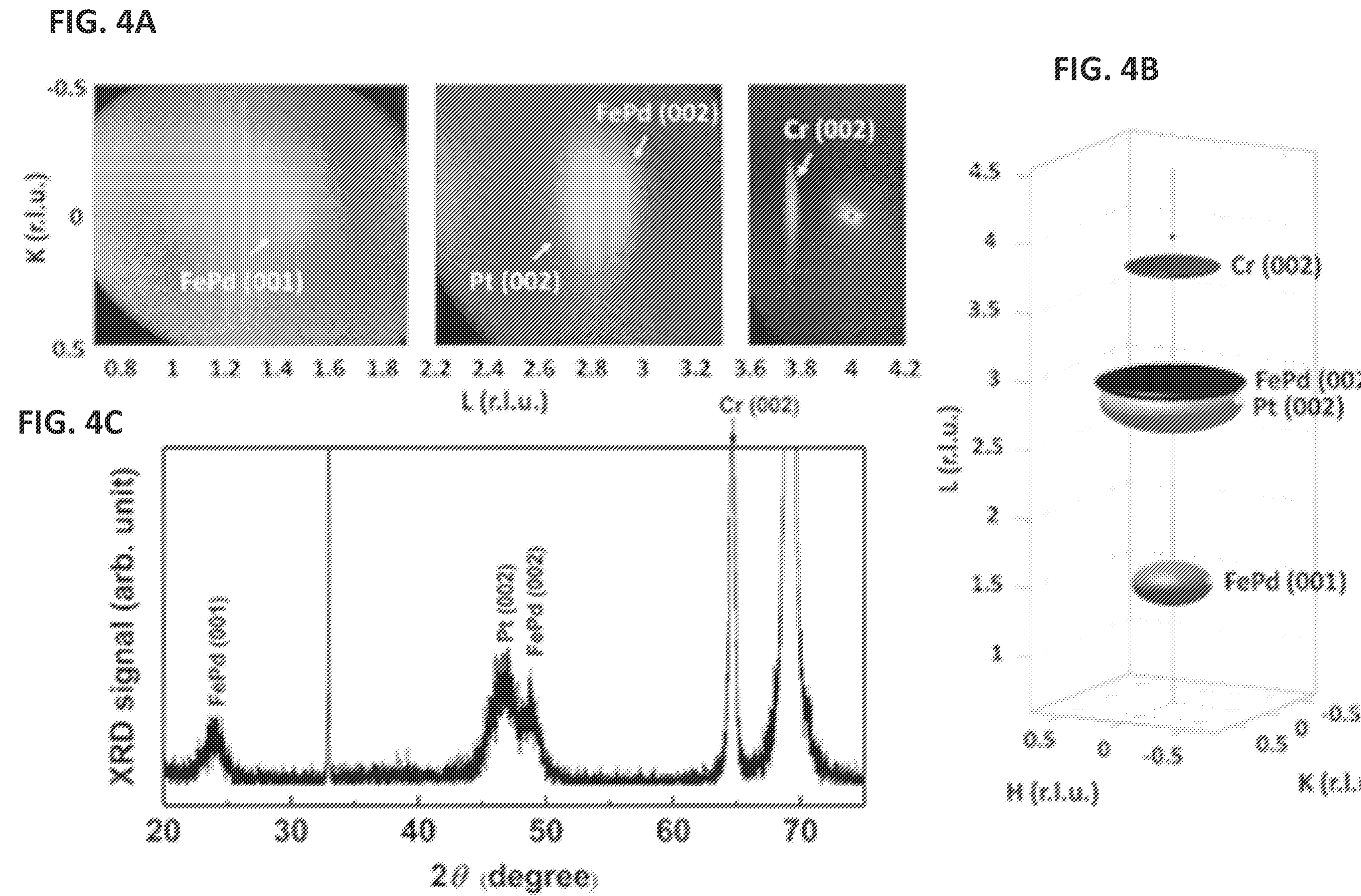
FIG. 4A illustrates example reciprocal space XRD patterns of a portion of an example device according to the present disclosure.
FIG. 4B is a 3D representation of reciprocal space maps shown in FIG. 4A.
FIG. 4C is a chart illustrating θ-2θ spectrum of the XRD signal.

The crystal structures and registry between layers of an example device were explored by X-ray diffraction (XRD) studies. By using a Bruker D8 Discover microdiffractometer equipped with a Vantec 500 2D detector and a Hubber ¼ Eulerian cradle, reciprocal space maps of the sample were collected. The scattering peaks of individual layers are assigned in different panels of FIG. 4A. In FIG. 4A, the illustrations include large area reciprocal space maps (HL projection). The scattered intensity is represented with a temperature-colored scale. From left to right, the FePd(001) peak can be identified, confirming the strong (001) texture and $L1_0$ ordering of FePd sputtered on Si/$SiO_2$ wafers, as well as the Pt(002) and FePd(002) peaks, which are close to each other but still distinguishable, and the Cr(002) peak. Both the bilayer buffer and FePd obeyed (001)-textured growth on the MgO layer, which may be a precondition of the high PMA and low $\alpha$ of $L1_0$-FePd(001).

It was also observed that the structural coherence of the layers is better in the direction of the growth than in the in-plane directions, which highlights the good crystalline quality of the layers despite the granular-oriented morphology imposed by the MgO layer. The high crystallinity and strong texture of the sample can be better visualized in FIG. 4B, where the peak intensity in HL and KL projections (H, K and L reflect the coordinate basis associated with the crystal) are extracted, temperature-colored with a scale approximately matching the one of FIG. 4A, and presented in a 3D form. In FIG. 4B, the 3D representation is of the 00L specular rod. In this representation, the scattering ellipsoids are obtained from the fitting of individual peaks in both the HL and KL projections.

The conventional θ-2θ spectrum is plotted in FIG. 4C. Based on the peak positions and intensity, the out-of-plane lattice parameters of Cr, Pt, and FePd are estimated to be (2.88±0.01) Å, (3.90±0.03) Å, and (3.73±0.02) Å, respectively, in which uncertainties are associated with pseudo-Voigt fits to the data. The $L1_0$ ordering parameter(S) of FePd is calculated to be 0.73±0.01, also comparable to the counterparts using MgO(001) or $SrTiO_3$(001) substrates. The MgO peaks are not observed due to its small thickness $t_{MgO} = 5$ nm and low electron density, however the crystallinity of the MgO layer is later confirmed with STEM measurements. The unlabeled peaks with very high intensity and narrow spread are from the substrate lattice.

Figure 5A:
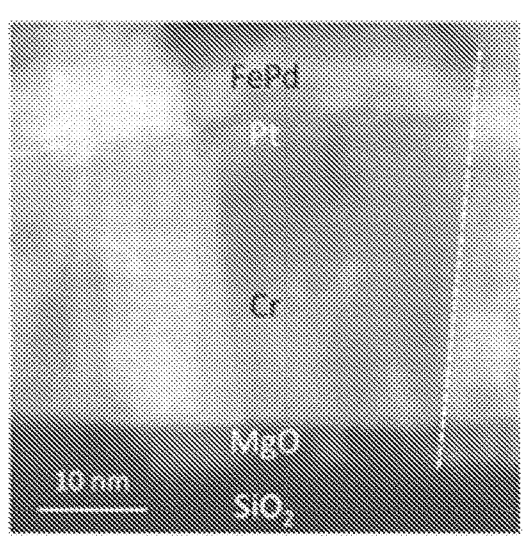
FIG. 5A is a cross-sectional HAADF image of a portion of an example device according to the present disclosure.
Figure 5B:
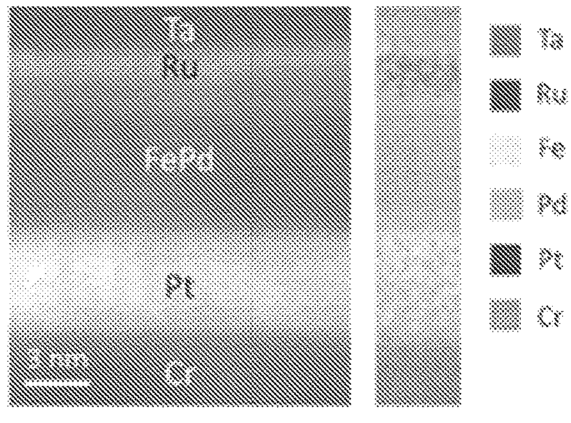
FIG. 5B is a cross-sectional image of a portion of the example sample of FIG. 5A.
Figure 5C:
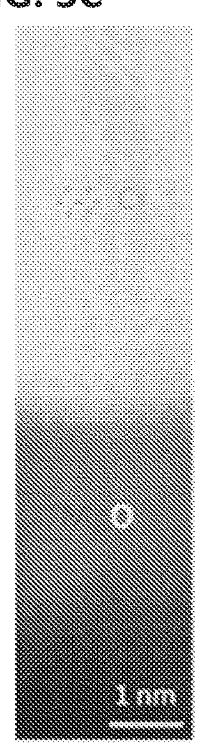
FIG. 5C is a cross-sectional STEM image illustrating interfaces between the layers of an example device at atomic resolution.
Figure 5C:
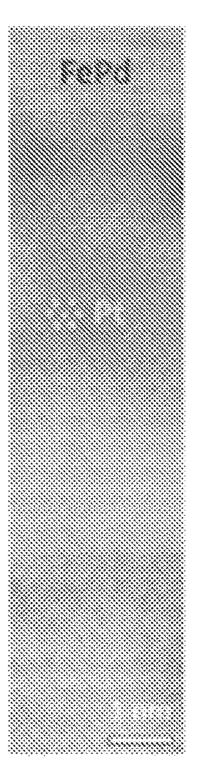
Figure 5D:
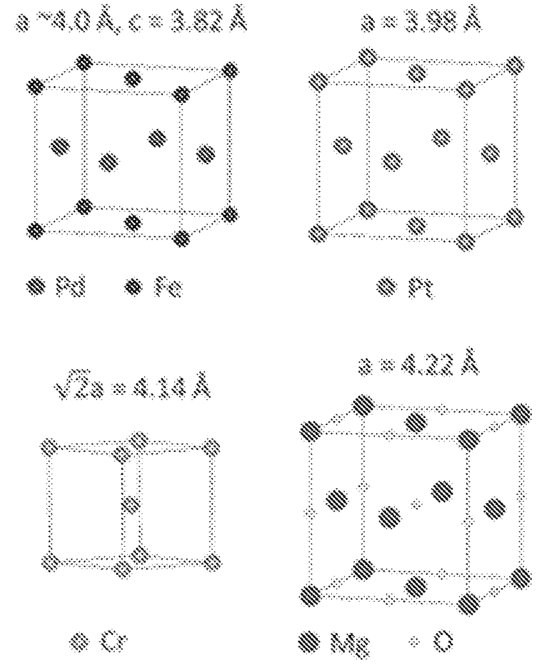
FIG. 5D is a schematic diagram illustrating crystalline structures and estimated lattice parameters of $L1_0$-FePd, Pt, Ct, and MgO.

The microstructure of the MgO layer and the epitaxial relationship of the stack were studied by STEM. FIG. 5A shows a cross-sectional image of the stack under the high-angle annular dark field (HAADF) mode. The dashed line marks a grain boundary. It is clear that both the bilayer buffer and $L1_0$-FePd followed a grain-on-grain heteroepitaxial growth on textured MgO. The grain boundaries, one of which is marked by the dashed line, are shared by the MgO seed layer, bilayer buffer, as well as FePd. This epitaxial growth is established from MgO since it tends to form (001) texture on amorphous surfaces, of which CoFeB is a known example. A zoomed-in image around the FePd layer and the energy dispersive X-ray (EDX) profile is shown in FIG. 5B. The portion illustrates the $L1_0$-FePd and EDX elemental distribution. As illustrated, the interfaces are flat and sharp, showing no significant interdiffusion during the sputtering and annealing processes. By taking atomic-resolution images (FIG. 5C) and nanobeam diffraction (NBD) patterns (shown later), the lattice parameters of each layer were estimated, as illustrated in FIG. 5D. The lattice parameters are consistent with the values obtained from XRD measurements. The epitaxial relationship was inferred to be MgO (001)/Cr [110](001)/Pt [100](001)/$L1_0$-FePd [100](001), in which the Cr/Pt buffer can effectively release the lattice misfit between MgO and $L1_0$-FePd.

In addition, FePd-based p-SAFs on Si/$SiO_2$ wafers were prepared by inserting a sub-nm Ir spacer ($t_{Ir}$ is wedged from 4.5 to 6.0 Å) between two $L1_0$-FePd layers.

Figures 6A, 6B, 6C, 6D:
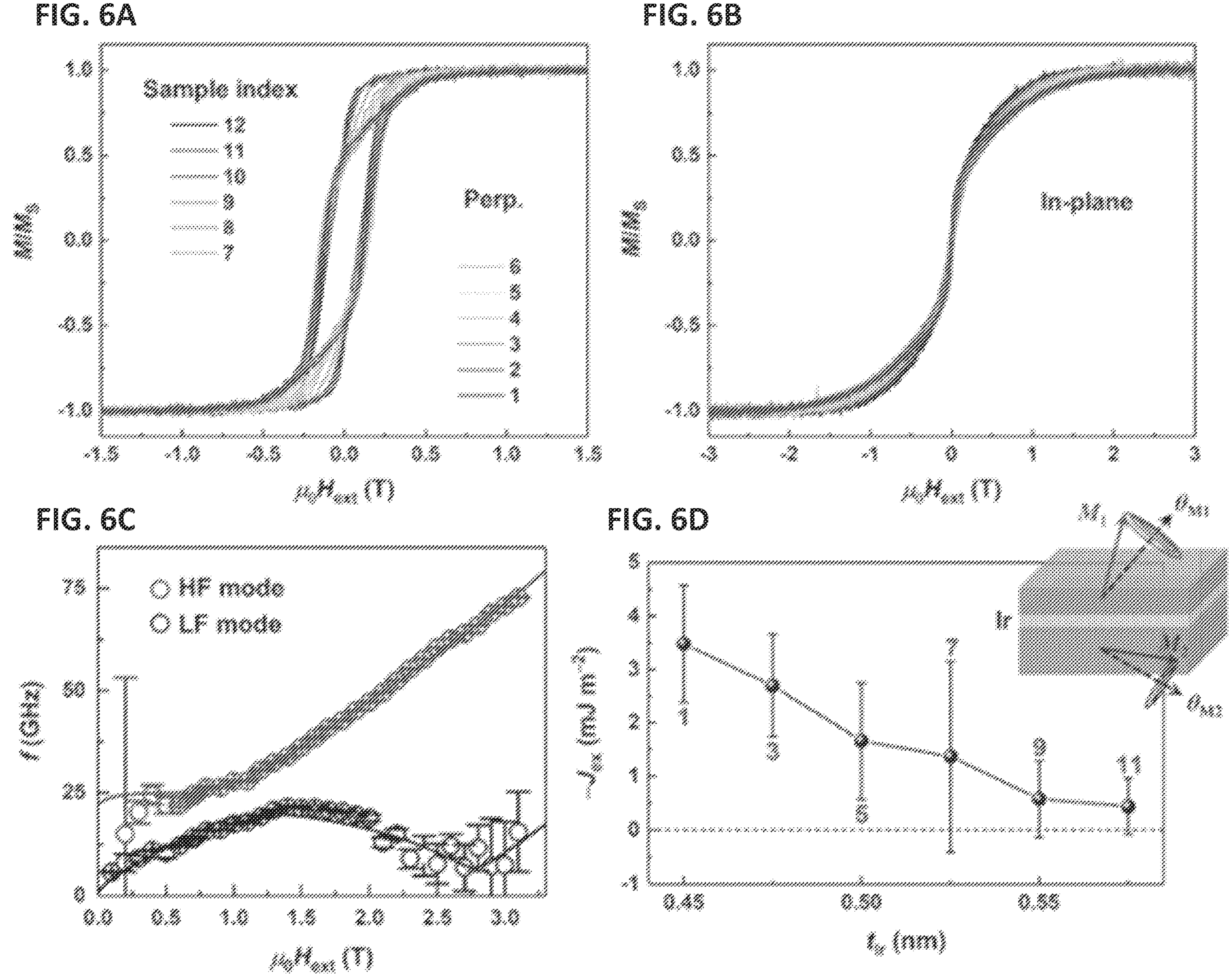
FIGS. 6A-6D illustrate hysteresis loops of FePd-based p-SAFs.

The samples were cleaved along the wedge direction and indexed from 1 to 12. Their M-$H_{ext}$ hysteresis loops, as shown in FIG. 6A and FIG. 6B, indicate strong PMA with all $t_{Ir}$ and markedly larger in-plane saturation field (by nearly 1 T magnitude) compared to the out-of-plane saturation field. That is, both the top and bottom FePd layers are (001)-textured. By increasing fir, the M-$H_{ext}$ loop gradually changes from a compensated antiferromagnetic configuration to a ferromagnetic-like configuration in which two FePd layers reverse almost coherently. That means, within the $t_{Ir}$ range of this study, a monotonic decrease of IEC strength as $t_{Ir}$ increases. FIG. 6A illustrates the perpendicular direction, while FIG. 6B illustrate the in-plane $H_{ext}$. FIG. 6C illustrates field-dependent f of HF and LF in Sample 1 ($\theta_H$=) 85°. Circles and lines denote measurement data and theoretical fits, respectively. FIG. 6D is a chart illustrating $-J_{ex}$ of FePd-based p-SAFs vs. sample index (by number) and nominal tr. Inset: Schematic of high-fidelity TR-MOKE metrology developed to study p-SAFs. $M_1$, $M_2$, $\theta_{M1}$, and $\theta_{M2}$ denote the magnetization of the top and bottom $L1_0$-FePd layers and their equilibrium angles under $H_{ext}$, respectively.

Based on SAF magnetization switching behaviors, the top FePd layer is found to switch first as it was prepared to be thinner (3 nm) than the bottom FePd layer (6 nm). In the M-$H_{ext}$ loops of low index samples, the gradual transition of the magnetizations from antiparallel to parallel is consistent with the magnetic free energy of a p-SAF with Ku near parity with $-J_{ex}/t_{FePd,top}$. Since overcoming PMA to rotate $L1_0$-FePd layers into the plane and IEC to force them aligned cost certain amounts of Zeeman energy, the anisotropy and exchange fields should be approximately additive. Assuming the intrinsic magnetic properties of $L1_0$-FePd layers remain constant among such a narrow fir range of only ~1.5 Å, the areas contoured by two in-plane hysteresis curves should reflect their difference in the IEC energy. Therefore, it is also observed that $-J_{ex}$ decreases as $t_{Ir}$ increases. To quantitatively measure $-J_{ex}$, the TR-MOKE technique was employed to study the p-SAFs as a function of $t_{Ir}$. Capable of measuring dynamics up to the THz range, TR-MOKE is a powerful tool to characterize p-SAFs with high PMA and IEC. By fitting the field-dependent f in the high-(HF) and low-frequency (LF) modes, $J_{ex}$ can be calculated by $J_{ex}=J_1+2J_2$, with $J_1$ and $J_2$ the extracted bilinear and biquadratic exchange coupling constants, respectively.

As a representative example, FIG. 6C shows the field-dependence off in both precessional modes of Sample 1. The fitting curve gives $-J_{ex}=3.48\pm1.09$ mJ $m^{-2}$, which is ~34% larger compared to the former result. In FIG. 6D, $-J_{ex}$ is plotted as a function of sample index and nominal $t_{Ir}$. In agreement with VSM results, $-J_{ex}$ decreases as $t_{Ir}$ increases, indicating the coverage of $t_{Ir}$ by the first (and strongest) antiferromagnetic range of Ir's Ruderman-Kittel-Kasuya-Yosida (RKKY) oscillation. A sketch of the p-SAF trilayer and TR-MOKE metrology is shown as the inset of FIG. 6D. Given the multiple advantages of p-SAFs over single-magnet counterparts, the FePd-based p-SAFs prepared on Si/$SiO_2$ wafers can further advance the application of scalable spintronic devices.

Figures 7A, 7B, 7C:
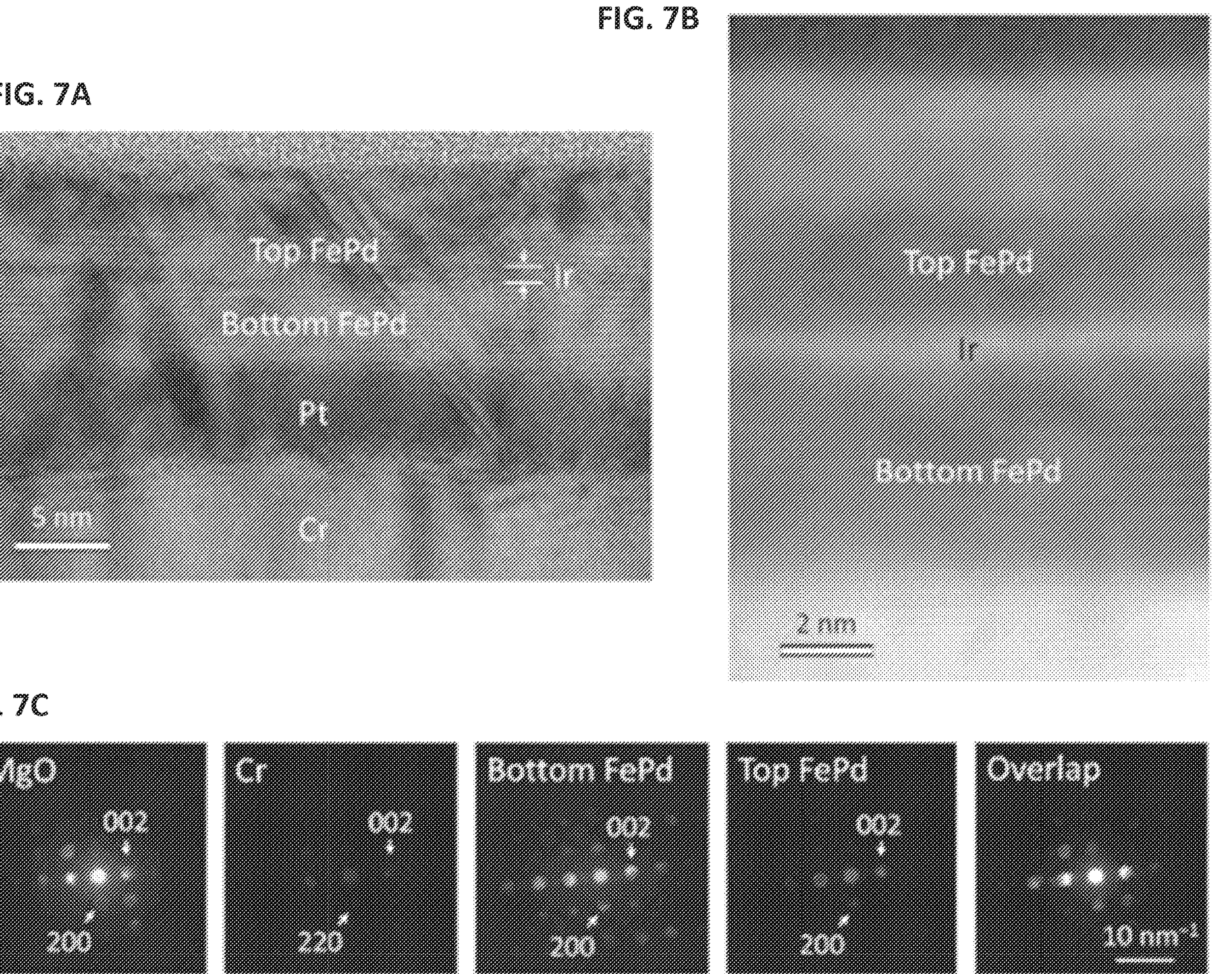
FIG. 7A is cross-sectional HRTEM image of an FePd-based p-SAF.
FIG. 7B is a STEM-HAADF image of an $L1_0$-FePd/Ir/$L1_0$-FePd trilayer PMA structure.
FIG. 7C illustrates NBD patterns collected within a single grain and their overlap.

One example for the enhancement of $-J_{ex}$ is attributed to the strong RKKY interaction of Ir as well as proper seed and buffer layers of $L1_0$-FePd on amorphous $SiO_2$ surface. To elucidate the high performance of $L1_0$-FePd/Ir/$L1_0$-FePd p-SAFs, high-resolution transmission electron microscopy (HRTEM) and STEM were performed to investigate their microstructure. As shown in FIG. 7A, the high crystallinity of both the top and bottom FePd layers is confirmed. Though the Ir spacer is ultrathin, it is still observable. By using the STEM-HAADF mode, the Ir spacer can be imaged with better contrast as shown in FIG. 7B, where the two FePd slabs are separated by a continuous Ir band. To illustrate the epitaxial relationship between each layer, especially the two FePd layers, NBD measurements to a single grain were conducted. The results, as presented in FIG. 7C, show a grain-on-grain heteroepitaxy through the Ir layer. Specifically, the SAF trilayer is textured as $L1_0$-FePd [100](001)/Ir/$L1_0$-FePd [100](001). Such an epitaxial growth, together with the sharp and flat interfaces between each layer, enables the considerable improvement in $-J_{ex}$.

Figure 8:
FIG. 8 is a schematic cross-sectional diagram illustrating an example device according to the present disclosure.
Figure 8:
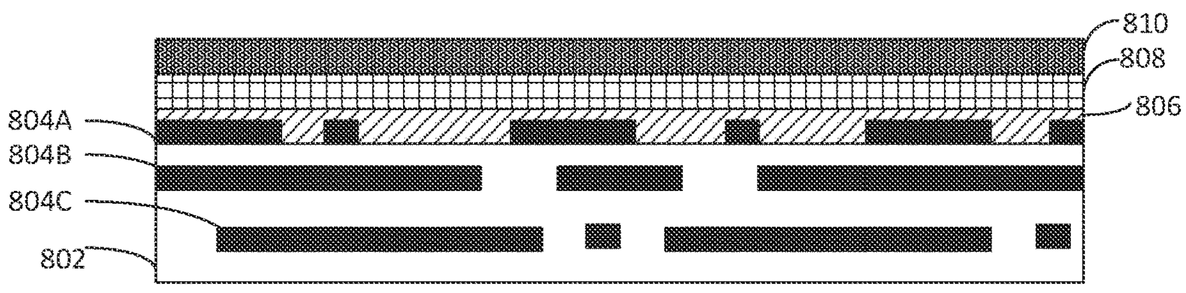

FIG. 8 is a cross-sectional diagram illustrating example device 800. Example device may be an example of the bottom stack of FIG. 2A. Device 800 includes silicon wafer substrate 802. Silicon wafer substrate 802 includes a plurality of metal layers 804A, 804B, and 804C ("metal layers 804"). Metal layers 804 may combine with silicon wafer substrate 802 to define a plurality of pre-patterned transistor structures ("CMOS structures"). Top metal layer 804A may be covered by seed layer 806, which may be configured to allow epitaxial growth of further layers as described above. For example, device 800 may include one or more bridge layers 808 (buffer layers). Device 800 may include PMA structure 810. PMA structure 810 may include at least one of iron-palladium (FePd) alloy, iron-platinum alloy (FePt), or iron-platinum-palladium alloy ($Fe(Pt_xPd_{(1-x)})$.

In one or more examples, device 800 is a CMOS device, such as may be part of an integrated circuit. For instance, PMA structure 810 and bridge layers 808 may together form part of a MTJ structure used for bit storage. As another example, PMA structure 810 and bridge layers 808 may together form part of the integrated circuit to control impedance, be coupled to transistors, from part of a memory device, form part of a logic device, etc. In some examples, device 800 may be a (SOT) MRAM device or a logic device. In some examples, device 800 may include silicon wafer substrate 802, seed layer 806 formed on a surface of silicon wafer substrate 802, perpendicular magnetic anisotropy (PMA) structure 810 exhibiting crystalline PMA formed on the seed layer, wherein PMA structure 810 includes at least one of iron-palladium alloy (FePd), iron-platinum alloy (FePt), or iron-platinum-palladium alloy ($Fe(Pt_xPd_{(1-x)})$. In some examples, device 800 may further include a magnetic tunnel junction bridge layer including a MgO tunnel barrier (not illustrated in FIG. 8) formed on PMA structure 810 and a hard perpendicular magnetic anisotropy (PMA) structure (not illustrated in FIG. 8). The hard PMA structure may exhibit PMA, ad may be formed on the magnetic tunnel junction bridge layer so that it acts as a tunnel barrier with a pinned magnetization orientation. Device 800 may further include a conducting layer (not illustrated in FIG. 8) formed on the hard PMA structure. A current delivered through the conducting layer, hard PMA structure, and the PMA structure may set a magnetization state of the PMA structure. In such examples, electrical stimulation of the SOT MRAM device may include measuring the tunneling magnetoresistance of the MRAM device and/or may include writing the orientation of the PMA structure.

Figure 9:
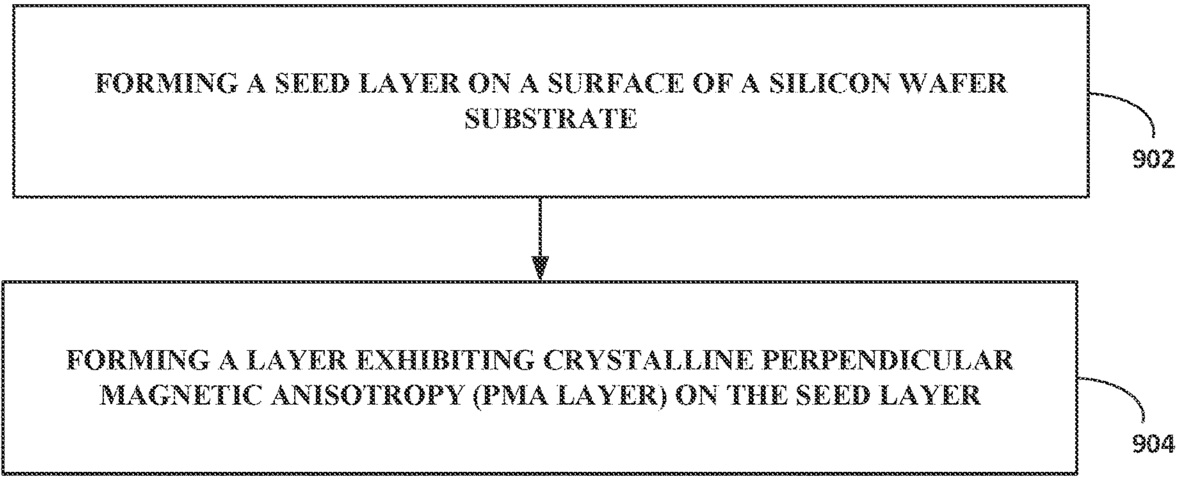
FIG. 9 is a flowchart illustrating an example technique for forming a device according to the present disclosure.

FIG. 9 is a flowchart illustrating an example technique for forming devices according to the present disclosure. The technique includes forming a seed layer on a surface of the silicon wafer substrate (902). In some examples, the seed layer may include at least one of magnesium oxide (MgO) or strontium titanate ($SrTiO_3$) having an (001) texture. The technique also includes forming a structure which exhibits crystalline perpendicular magnetic anisotropy ("PMA structure") on the seed layer (904). In some examples, the PMA structure includes iron-palladium (FePd) alloy.

As used herein, "formed on" and "on" means a layer or coating that is formed on top of another layer or coating, and encompasses both a first layer or coating formed immediately adjacent a second layer or coating and a first layer or coating formed on top of a second layer or coating with one or more intermediate layers or coatings present between the first and second layers or coatings. In one or more examples, "formed directly on" and "directly on" denote a layer or coating that is formed immediately adjacent another layer or coating, i.e., there are no intermediate layers or coatings.

In summary, high-quality $L1_0$-FePd(001) thin films were deposited on industry-compatible Si/$SiO_2$ wafers. Without expensive MgO(001) or $SrTiO_3$(001) substrates, the FePd thin films still possess strong PMA and low damping constant (α) with suitable seed and buffer layers (which may also be called "bridge layers"). Furthermore, by adding an Ir spacer, p-SAFs with markedly improved IEC were also achieved. The high performance of both the $L1_0$-FePd single layer and its SAF indicates high crystallinity, strong (001) texture, as well as an epitaxial growth on amorphous $SiO_2$ surface. Comprehensive characterizations were performed to reveal the lattice details of the MgO seed layer, Cr/Pt bilayer buffer, $L1_0$-FePd, and its SAF and the epitaxial relationship throughout the stack. As MgO, the crucial seed layer material in this study, has been widely used by the spintronics community and is deposited by conventional RF sputtering, our results removed a key obstacle of applying $L1_0$-FePd for deeply-scalable spintronic devices.

Examples of the disclosure are illustrated by the following clauses and claims:

Clause 1. A device, comprising: a silicon wafer substrate; a seed layer formed on a surface of the silicon wafer substrate; and a perpendicular magnetic anisotropy (PMA) structure exhibiting crystalline PMA formed on the seed layer, wherein the PMA structure comprises iron-palladium (FePd) alloy.

Clause 2. The device of clause 1, wherein the device comprises at least a portion of a memory device or a logic device.

Clause 3. The device of any of clause 1 or clause 2, wherein the device comprises a magnetic tunnel junction (MTJ), and wherein the PMA structure is a free layer.

Clause 4. The device of any of clauses 1-3, wherein the silicon wafer comprises both elemental silicon (Si) and silicon dioxide ($SiO_2$).

Clause 5. The device of any of clauses 1-4, wherein the surface of the silicon wafer substrate silicon wafer is an amorphous $SiO_2$ surface.

Clause 6. The device of clause 5, wherein the surface of the silicon wafer substrate defines one or more metallized contacts, and the one or more metallized contacts comprise copper, aluminum, tungsten, or other metals.

Clause 7. The device of any of clauses 1-6, wherein the seed layer comprises at least one of magnesium oxide (MgO) or strontium titanate ($SrTiO_3$) having an (001) texture.

Clause 8. The device of any of clauses 1-7, wherein the seed layer is polycrystalline.

Clause 9. The device of any of clauses 1-8, wherein the seed layer is a thin film having a thickness measured normal to the surface of the silicon wafer substrate of from about 0.5 nanometers to about 20 nanometers, or from about 1 nanometer to about 8 nanometers, or from about 2 nanometers to about 7 nanometers.

Clause 10. The device of any of clauses 1-9, wherein the FePd alloy defines an $L1_0$-phase structure.

Clause 11. The device of any of clauses 1-10, further comprising at least one bridge layer between the seed layer and the PMA structure.

Clause 12. The device of clause 11, wherein the at least one bridge layer comprises two bridge layers including a first bridge layer and a second bridge layer.

Clause 13. The device of clause 12, wherein the first bridge layer comprises chromium and the second bridge layer comprises platinum.

Clause 14. The device of clause 13, wherein the first bridge layer and the second bridge layer each define a respective thickness measured normal to the surface of the silicon wafer substrate, wherein the thickness of the first bridge layer is from about 8 nanometers to about 30 nanometers, and wherein the thickness of the second bridge layer is from about 1 nanometer to about 10 nanometers.

Clause 15. The device of any of clause 1-14, wherein the PMA structure defines a thickness measured normal to the surface of the silicon wafer substrate, wherein the thickness is from about 2 nanometers to about 15 nanometers.

Clause 16. The device of any of clause 1-15, wherein the PMA structure is formed with a plurality of sub-layers that form a synthetic antiferromagnetic (SAF) structure.

Clause 17. The device of clause 16, wherein the sub-layers include three sub-layers, wherein two of the three sub-layers comprise FePd.

Clause 18. The device of clause 17, wherein one of the three sub-layers comprises one or more of iridium (Ir), ruthenium (Ru), rhodium (Rh), chromium (Cr), rhenium (Re), osmium (Os), molybdenum (Mo), or combinations thereof.

Clause 19. The device of any of clauses 17 or 18, wherein a sub-layer comprising Ir is formed between the sub-layers comprising FePd.

Clause 20. The device of any of clause 1-19, further comprising a capping layer formed on the PMA structure.

Clause 21. The device of clause 20, wherein the capping layer comprises at least one of ruthenium (Ru) or tantalum (Ta).

Clause 22. The device of any of clause 1-21, further comprising a magnetic tunnel junction bridge layer formed on the PMA structure.

Clause 23. The device of any of clauses 1-22, wherein the bridge layer comprises at least one of cobalt manganese silicide ($Co_2MnSi$), cobalt iron silicide ($Co_2FeSi$), cobalt manganese aluminide ($Co_2MnAl$), cobalt iron aluminide ($Co_2FeAl$), alloys of cobalt iron boride (Co—Fe—B), molybdenum (Mo), ruthenium (Ru), tantalum (Ta), magnesium oxide (MgO) or magnesium aluminum oxide ($MgAl_2O_4$).

Clause 24. A method, comprising: forming a seed layer on a surface of a silicon wafer substrate; and forming a perpendicular magnetic anisotropy (PMA) structure exhibiting crystalline PMA on the seed layer, wherein the PMA structure comprises iron-palladium (FePd) alloy.

Clause 25. The method of clause 24, wherein forming the seed layer comprises sputtering the seed layer on the surface of the silicon wafer substrate.

Clause 26. The method of clause 25, wherein sputtering the seed layer comprises at least one of direct-current magnetron sputtering or RF sputtering.

Clause 27. The method of any of clauses 24-26, wherein forming the PMA structure comprises epitaxially growing the PMA structure formed on the seed layer.

Clause 28. The method of any of clauses 24-27, wherein the silicon wafer comprises both elemental silicon (Si) and silicon dioxide ($SiO_2$).

Clause 29. The method of any of clauses 24-28, wherein the surface of the silicon wafer substrate silicon wafer is an amorphous $SiO_2$ surface.

Clause 30. The method of any of clauses 24-29, wherein the seed layer comprises magnesium oxide (MgO) or strontium titanate ($SrTiO_3$) having an (001) texture.

Clause 31. The method of any of clauses 24-30, wherein the seed layer is polycrystalline.

Clause 32. The method of any of clauses 24-31, wherein the seed layer is a thin film having a thickness measured normal to the surface of the silicon wafer substrate of from about 0.5 nanometers to about 20 nanometers, or from about 1 nanometer to about 8 nanometers, or from about 2 nanometers to about 7 nanometers.

Clause 33. The method of any clauses 24-32, wherein the seed layer is exposed to thermal processing in an $N_2$ environment for a duration from about 1 minute to 60 minutes, or from about 10 minutes to 50 minutes, or from about 20 minutes to 40 minutes at a fixed temperature from about 100 degrees C. to 800 degrees C., or from about 300 degrees C. to 700 degrees C., or from about 400 degrees C. to 600 degrees C.

Clause 34. The method of clauses 24-33, wherein the seed layer is exposed to thermal processing in an $O_2$ environment for a duration from about 1 minute to 60 minutes, or from about 10 minutes to 50 minutes, or from about 20 minutes to 40 minutes at a fixed temperature from about 100 degrees C. to 800 degrees C., or from about 300 degrees C. to 700 degrees C., or from about 400 degrees C. to 600 degrees C.

Clause 35. The method of any of clauses 24-34, wherein the FePd alloy defines an $L1_0$-phase structure.

Clause 36. The method of any of clauses 24-35, further comprising forming at least one bridge layer between the seed layer and the PMA structure.

Clause 37. The method of clause 36, wherein forming the at least one bridge layer comprises forming two bridge layers including a first bridge layer and a second bridge layer.

Clause 38. The method of clause 36, wherein forming at least one bridge layer includes forming a first bridge layer, wherein forming the first bridge layer includes a thermal processing step in a vacuum environment for a duration from about 1 minute to 30 minutes, or from about 2 minutes to 20 minutes, or from about 5 minutes to 15 minutes at a fixed temperature from about 100 degrees C. to 800 degrees C., or from about 300 degrees C. to 700 degrees C., or from about 400 degrees C. to 600 degrees C.

Clause 39. The method of clause 37, further comprising forming a second bridge layer subsequent to forming the first bridge layer, wherein forming the second bridge layer includes a thermal processing step in a vacuum environment for a duration from about 1 minute to 30 minutes, or from about 2 minutes to 20 minutes, or from about 5 minutes to 15 minutes at a fixed temperature from about 100 degrees C. to 800 degrees C., or from about 300 degrees C. to 700 degrees C., or from about 400 degrees C. to 600 degrees C.

Clause 40. The method of clause 37, wherein the first bridge layer comprises chromium and the second bridge layer comprises platinum.

Clause 41. The method of clause 40, wherein the first bridge layer and the second bridge layer each define a respective thickness measured normal to the surface of the silicon wafer substrate, wherein the thickness of the first bridge layer is from about 8 nanometers to about 30 nanometers, and wherein the thickness of the second bridge layer is from about 1 nanometer to about 10 nanometers.

Clause 42. The method of any of clauses 24-41, wherein the PMA structure defines a thickness measured normal to the surface of the silicon wafer substrate, wherein the thickness is from about 2 nanometers to about 15 nanometers.

Clause 43. The method of any of clauses 24-42, wherein forming the PMA structure comprises forming a plurality of sub-layers that form a synthetic antiferromagnetic (SAF) structure.

Clause 44. The method of clause 43, wherein the PMA structure defines three layers including a first sub-layer, a second sub-layer, and a third sub-layer, wherein two of the three sub-layers comprise FePd.

Clause 45. The method of any of clauses 24-44, wherein forming the PMA structure includes a thermal processing step in a vacuum environment for a duration from about 1 minute to 30 minutes, or from about 2 minutes to 20 minutes, or from about 5 minutes to 15 minutes at a fixed temperature from about 100 degrees C. to 800 degrees C., or from about 300 degrees C. to 700 degrees C., or from about 400 degrees C. to 600 degrees C.

Clause 46. The method of any of clauses 24-45, further comprising forming a capping layer on the PMA structure.

Clause 47. The method of any of clauses 24-46, further comprising forming a magnetic tunnel junction bridge layer on the PMA structure.

Clause 48. The method of clause 36, wherein the at least one bridge layer comprises at least one of cobalt manganese silicide ($Co_2MnSi$), cobalt iron silicide ($Co_2FeSi$), cobalt manganese aluminide ($Co_2MnAl$), cobalt iron aluminide ($Co_2FeAl$), alloys of cobalt iron boride (Co—Fe—B), molybdenum (Mo), ruthenium (Ru), tantalum (Ta), magnesium oxide (MgO) or magnesium aluminum oxide ($MgAl_2O_4$).

Clause 49. A spin-orbit torque (SOT) MRAM device or a logic device comprising: a silicon wafer substrate; a seed layer formed on a surface of the silicon wafer substrate; a perpendicular magnetic anisotropy (PMA) structure exhibiting crystalline PMA formed on the seed layer, wherein the PMA structure comprises at least one of iron-palladium alloy (FePd), iron-platinum alloy (FePt), or iron-platinum-palladium alloy ($Fe(Pt_xPd_{(1-x)})$; a magnetic tunnel junction bridge layer including a MgO tunnel barrier; a hard perpendicular magnetic anisotropy (PMA) structure exhibiting PMA formed on the MgO tunnel barrier with a pinned magnetization orientation; and a conducting layer formed on the hard PMA structure, wherein a current delivered through the conducting layer, hard PMA structure, and the PMA structure sets a magnetization state of the PMA structure.

Clause 50. The device of clause 49, wherein the magnetization state of the PMA structure sets a magnetoresistance of the MRAM or logic device.

Clause 51. The device of clauses 49 or 50, wherein the current is used to set the magnetization state of the PMA structure to indicate a logic value.

Clause 52. A device, comprising: a silicon wafer substrate with pre-patterned transistors structures and metal layers including a top metal layer; a seed layer formed on a surface of the top metal layer; and a perpendicular magnetic anisotropy (PMA) structure exhibiting crystalline PMA formed on the seed layer, wherein the PMA structure comprises at least one of iron-palladium (FePd) alloy, iron-platinum alloy (FePt), or iron-platinum-palladium alloy ($Fe(Pt_xPd_{(1-x)})$.

Clause 53. The device of clause 52, wherein the device comprises at least a portion of a memory device or a logic device.

Clause 54. The device of any of clause 52 or clause 53, wherein the device comprises a magnetic tunnel junction (MTJ), and wherein the PMA structure is a free layer.

Clause 55. The device of any of clauses 1, 49, or 52, wherein the PMA structure is doped with a dopant, and wherein the dopant comprises from about 0.05 atomic percent to about 30% of the PMA structure.

Clause 56. The device of clause 55, wherein the dopant comprises one or more of cobalt (Co), nickel (Ni), copper (Cu), manganese (Mn), vanadium (V), chromium (Cr), or combinations thereof.

The invention claimed is:

1. A device, comprising:
- a silicon wafer substrate;
- a seed layer formed on a surface of the silicon wafer substrate, wherein the seed layer comprises at least one of magnesium oxide (MgO) or strontium titanate ($SrTiO_3$) having an (001) texture; and
- a perpendicular magnetic anisotropy (PMA) structure exhibiting crystalline PMA formed on the seed layer, wherein the PMA structure comprises at least one of iron-palladium (FePd) alloy, iron-platinum alloy (FePt), or iron-platinum-palladium alloy ($Fe(Pt_xPd_{(1-x)})$).

2. The device of claim 1, wherein the device comprises at least a portion of a memory device or a logic device.

3. The device of claim 1, wherein the device comprises a magnetic tunnel junction (MTJ), and wherein the PMA structure is a free layer.

4. The device of claim 1, wherein the silicon wafer comprises both elemental silicon (Si) and silicon dioxide ($SiO_2$).

5. The device of claim 1, wherein the surface of the silicon wafer substrate is an amorphous $SiO_2$ surface.

6. The device of claim 5, wherein the surface of the silicon wafer substrate defines one or more metallized contacts, and the one or more metallized contacts comprise copper, aluminum, tungsten, or other metals.

7. The device of claim 1, wherein the seed layer is polycrystalline.

8. The device of claim 1, wherein the seed layer is a thin film having a thickness measured normal to the surface of the silicon wafer substrate of from about 0.5 nanometers to about 20 nanometers.

9. The device of claim 1, wherein the PMA structure defines an $L1_0$-phase structure.

10. The device of claim 1, further comprising at least one bridge layer between the seed layer and the PMA structure.

11. The device of claim 10, wherein the at least one bridge layer comprises two bridge layers including a first bridge layer and a second bridge layer.

12. The device of claim 11, wherein the first bridge layer comprises chromium and the second bridge layer comprises platinum.

13. The device of claim 12, wherein the first bridge layer and the second bridge layer each define a respective thickness measured normal to the surface of the silicon wafer substrate,
- wherein the thickness of the first bridge layer is from about 8 nanometers to about 30 nanometers, and
- wherein the thickness of the second bridge layer is from about 1 nanometer to about 10 nanometers.

14. The device of claim 1, wherein the PMA structure defines a thickness measured normal to the surface of the silicon wafer substrate, wherein the thickness is from about 2 nanometers to about 15 nanometers.

15. The device of claim 1, wherein the PMA structure is formed with a plurality of sub-layers that form a synthetic antiferromagnetic (SAF) structure.

16. The device of claim 15, wherein the sub-layers include three sub-layers, wherein two of the three sub-layers comprise FePd.

17. The device of claim 16, wherein one of the three sub-layers comprises one or more of iridium (Ir), ruthenium (Ru), rhodium (Rh), chromium (Cr), rhenium (Re), osmium (Os), molybdenum (Mo), or combinations thereof.

18. A spin-orbit torque (SOT) MRAM device or a logic device comprising:
- a silicon wafer substrate;
- a seed layer formed on a surface of the silicon wafer substrate;
- a perpendicular magnetic anisotropy (PMA) structure exhibiting crystalline PMA formed on the seed layer, wherein the PMA structure defines an $L1_0$-phase structure and comprises at least one of iron-palladium alloy (FePd), iron-platinum alloy (FePt), or iron-platinum-palladium alloy ($Fe(Pt_xPd_{(1-x)})$);
- a magnetic tunnel junction bridge layer including a MgO tunnel barrier;
- a hard perpendicular magnetic anisotropy (PMA) structure exhibiting PMA formed on the MgO tunnel barrier with a pinned magnetization orientation; and
- a conducting layer formed on the hard PMA structure, wherein a current delivered through the conducting layer, hard PMA structure, and the PMA structure sets a magnetization state of the PMA structure.

19. A device, comprising:
- a silicon wafer substrate with pre-patterned transistor structures and metal layers including a top metal layer;
- a seed layer formed on a surface of the top metal layer;
- a bridge layer formed on a surface of the seed layer; and
- a perpendicular magnetic anisotropy (PMA) structure exhibiting crystalline PMA formed on the bridge layer, wherein the PMA structure comprises at least one of iron-palladium (FePd) alloy, iron-platinum alloy (FePt), or iron-platinum-palladium alloy ($Fe(Pt_xPd_{(1-x)})$).

20. A method, comprising:
- forming a seed layer on a surface of a silicon wafer substrate; and
- forming a perpendicular magnetic anisotropy (PMA) structure exhibiting crystalline PMA on the seed layer, wherein forming the PMA structure comprises forming a plurality of sub-layers that together form a synthetic antiferromagnetic (SAF) structure, and wherein the PMA structure comprises at least one of iron-palladium (FePd) alloy, iron-platinum alloy (FePt), or iron-platinum-palladium alloy ($Fe(Pt_xPd_{(1-x)})$).

* * * * *